(12) United States Patent
Yamazaki et al.

(10) Patent No.: US 7,511,418 B2
(45) Date of Patent: Mar. 31, 2009

(54) LIGHT EMITTING ELEMENT, LIGHT EMITTING DEVICE AND MANUFACTURING METHOD OF LIGHT EMITTING ELEMENT

(75) Inventors: Shunpei Yamazaki, Tokyo (JP); Ryoji Nomura, Kanagawa (JP); Kaoru Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 435 days.

(21) Appl. No.: 11/383,655

(22) Filed: May 16, 2006

(65) Prior Publication Data
US 2006/0261728 A1 Nov. 23, 2006

(30) Foreign Application Priority Data
May 20, 2005 (JP) ............................. 2005-148733

(51) Int. Cl.
*H01J 1/62* (2006.01)
(52) U.S. Cl. ........................................ 313/504; 313/506
(58) Field of Classification Search .......... 313/503–512
See application file for complete search history.

(56) References Cited

U.S. PATENT DOCUMENTS
2005/0260442 A1* 11/2005 Yu et al. ..................... 428/690

* cited by examiner

Primary Examiner—Vip Patel
(74) Attorney, Agent, or Firm—Fish & Richardson P.C.

(57) ABSTRACT

It is an object of the present invention to provide a light emitting element and a light emitting device having high luminous efficiency. It is a further object of the present invention to provide a method for manufacturing the light emitting element using a simplified method compared with the conventional method. A light emitting element having a light emitting region which includes plural kinds of materials with a high luminous quantum yield, and one or plural kinds of materials with a high carrier transporting property and which has a structure where regions in which the material with a high luminous quantum efficiency is dispersed in a material with a high carrier transporting property and regions in which the concentration of the material with a high carrier transporting property is high are laminated alternately, between a pair of electrodes, is provided.

21 Claims, 16 Drawing Sheets

LIGHT EMITTING ELEMENT, LIGHT EMITTING DEVICE AND MANUFACTURING METHOD OF LIGHT EMITTING ELEMENT

BACKGROUND OF THE INVENTION

1. Field of the Invention

The present invention relates to a light emitting element utilizing electroluminescence and a light emitting device provided with the light emitting element. Further, the present invention relates to a method for manufacturing the light emitting element.

2. Description of the Related Art

In recent years, a light emitting element using a light emitting organic compound has been actively researched and developed. A basic structure of the light emitting element is that in which a layer containing a light emitting organic compound (light emitting layer) is sandwiched between a pair of electrodes. By applying voltage to this element, electrons and holes are separately injected from the pair of electrodes into the light emitting layer, and current flows. Then, recombination of these carriers (the electrons and holes) makes the light emitting organic compound in an excited state and emit light when the excited state returns to the ground state. Owing to such a mechanism, such a light emitting element is referred to as a current-excitation light emitting element.

Note that an excited state of an organic compound includes a singlet excited state and a triplet excited state. Light emission from the singlet excited state is referred to as fluorescence, and light emission from the triplet excited state is referred to as phosphorescence.

A great advantage of such a light emitting element is that the light emitting element can be manufactured to be thin and lightweight, since the light emitting element is generally formed of an organic thin film having a thickness of 0.1 µm or so. In addition, extremely high response speed is another advantage since period between carrier injection and light emission is approximately microseconds or less. These characteristics are considered suitable for a flat panel display element.

Such a light emitting element is formed in a film shape. Thus, surface emission can be easily obtained by forming a large area element. This characteristic is hard to be obtained by a point light source typified by an incandescent lamp or an LED or a line light source typified by a fluorescent lamp. Therefore, the above described light emitting element has high utility value also as a surface light source applicable to lighting or the like.

Thus, the current-excitation light emitting element using the light emitting organic compound is expected to be applied to a light emitting device, lighting, or the like. However, there are still many issues. Improvement in luminous efficiency is one of the issues.

For instance, when a display device for color display is manufactured using a light emitting element, there is a method for obtaining three primary colors of red, green, and blue using a light emitting element of white color and a color filter. In this case, a red color filter transmits only red light in light emission from the light emitting element, and light with other wavelengths is blocked. At the same time, green and blue color filters transmit only green and blue light, respectively, and light with other wavelengths is blocked. Namely, when the light passes through the color filter, about two thirds of luminescence from the light emitting element are not taken out and are wasted. Therefore, a white light emitting element with much higher luminous efficiency is required.

SUMMARY OF THE INVENTION

In view of the foregoing, it is an object of the present invention to provide a light emitting element with high luminous efficiency and a light emitting device using the light emitting element. It is a further object of the present invention to provide a method for manufacturing a light emitting element with high luminous efficiency.

After keen examination, the present inventors have found that the issue of the invention can be solved by manufacturing a light emitting element having a light emitting region with a multiple quantum well structure.

Therefore, a light emitting element of the present invention includes a light emitting region between a pair of electrodes, which contains plural kinds of materials with a high luminous quantum yield, and one or plural kinds of materials with a high carrier transporting property. The light emitting region has a structure where a region in which a material with a high luminous quantum yield is dispersed in a material with a high carrier transporting property and a region in which the concentration of the material with a high carrier transporting property is high are laminated alternately. Namely, the light emitting region has a structure where a region in which the concentration of the material with a high luminous quantum yield included in a material with a high carrier transporting property is high and a region in which the concentration of the material with a high luminous quantum yield included in a material with a high carrier transporting property are laminated alternately.

For example, when the light emitting region includes two materials with a high luminous quantum yield and one kind of a material with a high carrier transporting property, the light emitting region has a structure where a region in which the concentration of a material with a high carrier transporting property is high, a region in which a first material with a high luminous quantum yield is dispersed in a material with a high carrier transporting property, and a region in which a second material with a high luminous quantum yield is dispersed in a material with a high carrier transporting property are laminated sequentially.

Furthermore, when the light emitting region includes three kinds of materials with a high luminous quantum yield and one kind of a material with a high carrier transporting property, the light emitting region has a structure where a region in which the concentration of the material with a high carrier transporting property is high; a region in which the first kind of a material with a high luminous quantum yield is dispersed in the material with a high carrier transporting property; a region in which the concentration of the material with a high carrier transporting property is high; a region in which the second kind of a material with a high luminous quantum yield is dispersed in the material with a high carrier transporting property; a region in which the concentration of the material with a high carrier transporting property is high; a region in which the third kind of a material with a high luminous quantum yield is dispersed in the material with a high carrier transporting property; and a region in which the concentration of the material with a high carrier transporting property is high are laminated alternately.

In the above structure, the highest occupied molecular orbital level of the material with a high luminous quantum yield is higher than that of the material with a high carrier transporting property, and the lowest unoccupied molecular orbital level of the material with a high luminous quantum yield is lower than that of the material with a high carrier transporting property.

In the above structure, the thickness of the region in which a material with a high luminous quantum yield is dispersed in a material with a high carrier transporting property is preferably 20 nm or less, more preferably, 5 nm, or less.

In the above structure, the region in which the concentration of the material with a high carrier transporting property is high, namely the region in which the concentration of the material with a high luminous quantum yield is low is preferably 20 nm or less, more preferably, 5 nm or less.

In the above structure, the region including a material with a high luminous quantum yield at high concentration contains the material with a high luminous quantum yield at 0.001 wt % to 50 wt %, preferably, 0.03 wt % to 30 wt %.

In the above structure, the plural kinds of materials with a high luminous quantum yield are materials emitting lights having a complementary color relationship.

In the above structure, the light emitting element emits white light.

In the above structure, the material with a high luminous quantum yield may be a material which emits fluorescence or a material which emits phosphorescence. When it is the material which emits phosphorescence, the triplet level of the material with a high luminous quantum yield is preferably lower than the triplet level of the material with a high carrier transporting property.

In the above structure, the material with a high carrier transporting property may be a material in which an electron transporting property is higher than a hole transporting property, or a material in which the hole transporting property is higher than the electron transporting property.

The present invention includes a light emitting device having the above mentioned light emitting element. The light emitting device in this specification includes a light emitting element and a control circuit for controlling the light-emission of the light emitting element. To be concrete, the light emitting device includes an image display device, or a light source having a lighting system. In addition, the light emitting devices all include a module in which a light emitting device is provided with a connector, for example, an FPC (Flexible printed circuit) or a TAB (Tape Automated Bonding) tape or a TCP (Tape Carrier Package), a module provided with a printed wiring board at an end of a TAB tape and TCP, and a module in which an IC (integrated circuit) is mounted on a light emitting element directly by a COG (Chip On Glass) method.

The present invention provides a method for manufacturing the light emitting element. A method for manufacturing the light emitting element of the invention includes the steps of: using a vapor deposition apparatus having a holder for holding a substrate; a holder for holding an evaporation source; a rotating plate having an opening between the holder for holding the substrate and the holder for holding the evaporation source, and rotating the rotating plate to control the film thickness of a laminated film.

A method for manufacturing a light emitting element of the present invention uses a vapor deposition apparatus including a holder for holding a substrate, a holder for holding three or more evaporation sources, and a rotating plate having plural openings. In each of the plural evaporation sources, one of plural materials with a high quantum yield and one or plural materials with a high carrier transporting property is held. By rotating the rotating plate, regions in which the concentrations of the plural materials with a high luminous quantum yield is high and regions in which a material with a high quantum yield is dispersed into a material with high carrier transporting property are laminated alternately. Namely, a region in which the concentration of the material with a high luminous quantum yield included in the material with a high carrier transporting property is high and a region in which the material with a high luminous quantum yield included in the material with a high carrier transporting property is low are laminated alternately.

In addition, a method for manufacturing a light emitting element of the present invention uses a vapor deposition apparatus including a holder for holding a substrate, a holder for holding three or more evaporation sources, and a rotating plate having a first opening and a second opening provided between the holder for holding the substrate and the holder for holding the evaporation sources. And each of the evaporation sources holds one of plural materials with a high luminous quantum yield and one or plural kinds of materials with a high carrier transporting property. The evaporation source for holding one of the materials with a high carrier transporting property is disposed so as to be close to the first opening when the rotating plate rotates; the evaporation source in which one of the materials with a high luminous quantum yield is held is disposed so as to be close to the second opening when the rotating plate rotates. By rotating the rotating plate, a region in which the concentration of the material with a high carrier transporting property is high is formed on the substrate when the first opening locates close to the evaporation source where the material with a high carrier transporting property is held; a region in which the concentration of the material with a high luminous quantum yield is high is formed when the second opening locates close to the evaporation source where the material with a high luminous quantum yield is held; and the regions in which the concentrations of the materials with a high carrier transporting property is high and regions in which the concentrations of the materials with a high luminous quantum yield is high are formed alternately. Namely, regions in which the concentrations of the materials with a high luminous quantum yield included in the materials with a high carrier transporting property is high, and regions in which the concentrations of the materials with a high luminous quantum yield included in the materials with high carrier transporting property is low are laminated alternately.

A method for manufacturing a light emitting element of the present invention uses a vapor deposition apparatus including a holder for holding a substrate, a holder for holding plural evaporation sources, and a rotating plate having a first opening and a second opening provided between the holder for holding the substrate and the holder for holding the evaporation sources. And, each of the plural evaporation sources holds one of n-kinds of (n is an integer of 2 or more) materials with a high luminous quantum yield and a material with a high carrier transporting property. The evaporation source holding the material with a high carrier transporting property is disposed so as to be close to the first opening when the rotating plate rotates, and the n-number of evaporation sources in each of which one of the materials with a high luminous quantum yield which are different from each other is held are disposed so as to be close to the second opening when the rotating plate rotates. By rotating the rotating plate, a region in which the concentration of the material with a high carrier transporting property is high is formed on the substrate when the first opening is disposed close to the evaporation source holding the material with a high carrier transporting property; a region in which the concentration of the material with a high luminous quantum yield is high is formed on the substrate when the second opening is disposed close to the evaporation sources in which the materials with a high luminous quantum yield is high is held, and a region in which the concentration of the material with a high carrier transporting property is high is formed between each region in which the concentration of the n-kinds of materials with a high luminous quantum yield is high are formed. Namely, regions in which the concentration of the material with a high luminous quantum yield included in the material with a high carrier transporting property is high, and regions in which the concentration of the material with a high luminous quantum yield included in the material with a high carrier transporting property is low are laminated alternately.

Furthermore, a method for manufacturing a light emitting element of the present invention uses a vapor deposition apparatus including a holder for holding a substrate, a holder for holding plural evaporation sources, and a rotating plate having a first opening and a second opening provided between the holder for holding the substrate and the holder for holding the evaporation sources. And each of the evaporation sources holds one of two kinds of materials with a high luminous quantum yield and a material with a high carrier transporting property. The evaporation source in which a material with a high carrier transporting property is held is disposed so as to be close to the first opening when the rotating plate rotates; the evaporation source in which a first material with the high luminous quantum yield is held is disposed so as to be close to the second opening when the rotating plate rotates, the evaporation source in which a second material with the high luminous quantum yield is held is disposed so as to be close to the second opening when the rotating plate rotates. By rotating the rotating plate, a region in which the concentration of the material with a high carrier transporting property is high is formed on the substrate when the first opening locates close to the evaporation source where the first material with a high carrier transporting property is held; a region in which the concentration of the luminous quantum yield is high is formed on the substrate when the second opening locates close to the evaporation source where the material with a high luminous quantum yield is held; a region in which the concentration of the material with the high carrier transporting property is high is formed when the first opening locates close to the evaporation source where the second material with a high carrier transporting property is held; and a region in which the concentration of the material with the high carrier transporting property is high is formed when the second opening locates close to the evaporation source in which the second material with a high carrier transporting property is held. Further, a region in which the concentration of the material with a high carrier transporting property is high, a region in which the concentration of the first material with a high luminous quantum yield is high, a region in which the concentration of the material with a high carrier transporting property is high, and a region in which the concentration of the second material with a high luminous quantum yield is high are formed repeatedly. Namely, regions in which the concentration of the material with a high luminous quantum yield included in the material with a high carrier transporting property is high, and regions in which the concentration of the material with a high luminous quantum yield included in the material with a high carrier transporting property is low are laminated alternately.

A method for manufacturing a light emitting element of the present invention uses a vapor deposition apparatus including a holder for holding a substrate, a holder for holding plural evaporation sources, and a rotating plate having a first opening and a second opening provided between the holder for holding the substrate and the holder for holding the evaporation sources. Each of the plural evaporation sources holds one of three kinds of materials with a high luminous quantum yield and a material with a high carrier transporting property. The evaporation source holding the material with a high carrier transporting property is dispersed so as to be close to the first opening when the rotating plate rotates, the evaporation source holding the first material with a high luminous quantum yield is disposed so as to be close to the second opening when the rotating plate rotates, the evaporation source holding the second material with a high luminous quantum yield is disposed so as to be close to the second opening when the rotating plate rotates, the evaporation source holding the third material with a high luminous quantum yield is disposed so as to be close to the second opening when the rotating plate rotates. By rotating the rotating plate, a region in which the concentration of the material with a high carrier transporting property is high is formed on the substrate when the first opening locates close to the evaporation source holding the material with a high carrier transporting property, a region in which the concentration of the material with a high luminous quantum yield is high is formed when the second opening locates close to the evaporation source holding the first material with a high luminous quantum yield, a region in which the concentration of the material with a high carrier transporting property is high is formed when the first opening locates close to the evaporation source holding a material with a high carrier transporting property, a region in which the concentration of the material with a high luminous quantum yield is high is formed on the substrate when the second opening locates close to the evaporation source holding the second material with a high luminous quantum yield, a region in which the concentration of the material with a high carrier transporting property high is formed on the substrate when the first opening locates close to the evaporation source holding the material with a high carrier transporting property, a region in which the concentration of the material with a high luminous quantum yield is high is formed on the substrate when the second opening locates close to the evaporation source holding the third material with a high luminous quantum yield. Further, the region in which the concentration of the material with a high carrier transporting property is high, the region in which the concentration of the first material with a high luminous quantum yield is high, the region in which the concentration of the material with a high carrier transporting property is high, the region in which the concentration of the second material with a high luminous quantum yield is high, the region in which the concentration of the material with a high carrier transporting property is high, and the region in which the concentration of the third material with a high luminous quantum yield is high are formed repeatedly. Namely, regions in which the concentration of the material with a high luminous quantum yield included in a material with a high carrier transporting property is high, and regions in which the concentration of the first material with a high luminous quantum yield included in a material with a high carrier transporting property is low are laminated alternately.

A method for manufacturing a light emitting element of the present invention uses a vapor deposition apparatus including a holder for holding a substrate, a holder for holding plural evaporation sources, and a rotating plate having a first opening and a second opening provided between the holder for holding the substrate and the holder for holding the evaporation sources. And each of the plural evaporation sources holds one of two kinds of materials with a high luminous quantum yield and two kinds of materials with a high carrier transporting property. The evaporation source holding a first material with a high carrier transporting property is disposed so as to be close to the first opening when the rotating plate rotates; the evaporation source holding a second material with a high carrier transporting property is disposed so as to be close to the first opening when the rotating plate rotates; the evaporation source holding a first material with a high luminous quantum yield is disposed so as to be close to the second opening when the rotating plate rotates; and the evaporation source holding a second material with a high luminous quantum yield is disposed so as to be close to the second opening when the rotating plate rotates. By rotating the rotating plate, a region in which the concentration of the first material with a high carrier transporting property is high is formed on the substrate when the first opening locates close to the evaporation source where the first material with a high carrier transporting property is held; a region in which the concentration of the material with a high luminous quantum yield is high is formed on the substrate when the second opening locates close to the evaporation source where the first material with a high luminous quantum yield is held; a region in which the concentration of the second material with a high carrier transporting property is high is formed on the substrate when the first opening locates close to the evaporation source where the second material with a high carrier transporting property is held; and a region in which the concentration of the material with a high luminous quantum yield is high is formed on the substrate when the second opening locates close to the evaporation source where the second material with a high luminous quantum yield is held. Further, the region in which the concentration of the first material with a high carrier transporting property is high, the region in which the concentration of the second material with a high carrier transporting property is high, the region in which the concentration of the second material with a high carrier transporting property is high, the region in which the concentration of the second material with a high luminous quantum yield is high are formed repeatedly. Namely, regions in which the concentration of the material with a high luminous quantum yield included in a material with a high carrier transporting property is high, and regions in which the concentration of the material with a high luminous quantum yield included in a material with a high carrier transporting property is low are laminated alternately.

A method for manufacturing a light emitting element of the present invention uses a vapor deposition apparatus including a holder for holding a substrate, a holder for holding plural evaporation sources, and a rotating plate having a first opening and a second opening provided between the holder for holding the substrate and the holder for holding the evaporation sources. And each of the plural evaporation sources holds one of three kinds of materials with a high luminous quantum yield and three kinds of materials with a high carrier transporting property. The evaporation source holding a first material with a high carrier transporting property is disposed so as to be close to the first opening when the rotating plate rotates; the evaporation source holding a second material with a high carrier transporting property is disposed so as to be close to the first opening when the rotating plate rotates; the evaporation source holding a third material with a high carrier transporting property is disposed so as to be close to the first opening when the rotating plate rotates; the evaporation source holding a first material with a high luminous quantum yield is disposed so as to be close to the second opening when the rotating plate rotates; the evaporation source holding a second material with a high luminous quantum yield is dispersed so as to be close to the second opening when the rotating plate rotates; and the evaporation source holding a third material with a high luminous quantum yield is dispersed so as to be close to the second opening when the rotating plate rotates. By rotating the rotating plate, a region in which the concentration of the first material with a high carrier transporting property is high is formed on the substrate when the first opening locates close to the evaporation source where the first material with high carrier transporting property is held; a region in which the concentration of the material with a high luminous quantum yield is high is formed on the substrate when the second opening locates close to the evaporation source where the first material with a high luminous quantum yield is held; a region in which the concentration of the second material with a high carrier transporting property is high is formed on the substrate when the first opening locates close to the evaporation source where the second material with a high carrier transporting property is held; a region in which the concentration of the material with a high luminous quantum yield is high is formed on the substrate when the second opening locates close to the evaporation source where the second material with a high luminous quantum yield is held; a region in which the concentration of the third material with a high carrier transporting property is high is formed on the substrate when the first opening locates close to the evaporation source where the third material with a high carrier transporting property is held; and a region in which the concentration of the material with a high luminous quantum yield is high is formed on the substrate when the second opening locates close to the evaporation source where the third material with a high luminous quantum yield is held. Further, the region in which the concentration of the first material with a high carrier transporting property is high, the region in which the concentration of the first material with a high luminous quantum yield is high, the region in which the concentration of the second material with a high carrier transporting property is high, the region in which the second material with a high luminous quantum yield is high, the region in which the concentration of the third material with a high carrier transporting property is high, the region in which the concentration of the third material with a high luminous quantum yield is high are formed repeatedly. Namely, regions in which the concentration of the material with a high luminous quantum yield included in a material with a high carrier transporting property is high, and regions in which the concentration of the material with a high luminous quantum yield included in a material with a high carrier transporting property is low are laminated alternately.

In the above structure, the highest occupied molecular orbital level of the material with a high luminous quantum yield is higher than that of the material with a high carrier transporting property, and a lowest unoccupied molecular orbital level of the material with a high luminous quantum yield is lower than that of the material with a high carrier transporting property Also, the material with a high luminous quantum yield means a material which emits light when electric current is flown through it. The material with a high carrier transporting property means a material injecting carriers efficiently into the material with a high luminous quantum yield, which is a luminescence center. The material with a high luminous quantum yield may show a higher luminous quantum yield than the material with a high carrier transporting property in solutions with a common concentration. On the other hand, the material with a high carrier transporting property may show a higher mobility of carriers than the material with a high luminous quantum yield. In the region in which the concentration of the material with a high luminous quantum yield is high or the region in which the material with a high luminous quantum yield is dispersed in the material with a high carrier transporting property, the concentration of the material with a high luminous quantum yield may be higher than the concentration of the material with a high carrier transporting property. In the region in which the concentration of the material with a high carrier transporting property is high, the concentration of the material with a high carrier transporting property may be higher than the concentration of the material with a high luminous quantum yield.

In the above structure, the thickness of the region in which a material with a high luminous quantum yield is dispersed in a material with a high carrier transporting property is preferably 20 nm or less, more preferably, 5 nm, or less.

In the above structure, the thickness of the region in which the concentration of the material with a high carrier transporting property is high is low is preferably 20 nm or less, more preferably, 5 nm or less.

In the above structure, the region in which the concentration of the material with a high luminous quantum yield is high contains the material with a high luminous quantum yield at 0.001 wt % to 50 wt %, more preferably, 0.03 wt % to 30 wt %.

In the above structure, plural kinds of materials with a high luminous quantum yield are materials emitting lights having a relationship of complementary colors. Note that "complementary colors" means colors having a relation between the colors which become an achromatic color when they are mixed. In other words, white light can be obtained by mixing materials emitting lights having a relationship of complementary colors.

In the above structure, the light emitting element emits white light.

The light emitting element of the present invention has a light emitting region of a multiple quantum well structure, and therefore, luminous efficiency thereof is high. Moreover, since the light emitting element of the present invention includes plural materials with a high luminous quantum yield, a light emitting element which emits light of a desired color, for example, white light, and which has a high luminous efficiency can be obtained.

Since the light emitting device of the present invention has a light emitting element with a high luminous efficiency, power consumption is low.

In the method for manufacturing a light emitting element according to the present invention, a light emitting region with a multiple quantum well structure containing plural materials with a high luminous quantum yield can be easily formed; thereby throughput thereof can be improved.

DETAILED DESCRIPTION OF THE INVENTION

Figure 1A:
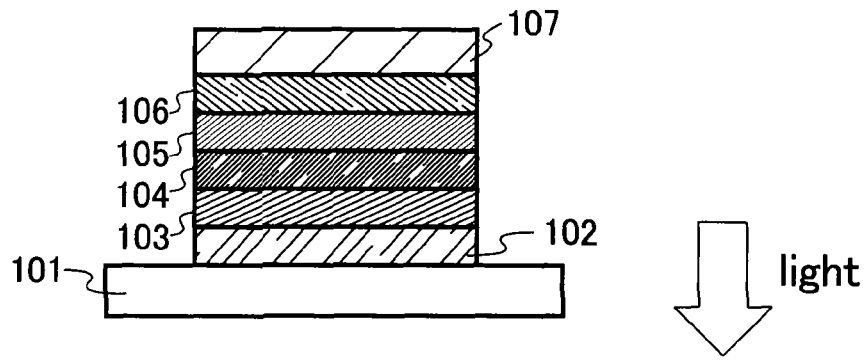
FIGS. 1A to 1C are diagrams describing a light emitting element of the present invention.

Hereinafter, embodiment modes of the invention are described with reference to the drawings. However, the present invention can be carried out in many different modes, and it is easily understood by those of ordinary skill in the art that the modes and the detail of the invention can be changed variously unless otherwise such changes and modifications depart from the purpose and the scope of the present invention.

Embodiment Mode 1

In this embodiment mode, a light emitting element of the present invention, particularly, a light emitting region thereof is described.

The light emitting region of the light emitting element according to the present invention has a multiple quantum well structure. Specifically, the light emitting region is composed by combining a material with a high carrier transporting property which is hardly crystallized (hereinafter referred to as a host material) and a material with a high luminous quantum yield (hereinafter referred to as a guest material).

As the material with a high carrier transporting property, for example, a silicon compound such as tetraphenylsilane or tetra(3-methylphenyl)silane, an anthracene derivative such as 9,10-diphenylanthracene or 9,10-di(2-naphthyl)anthracene, a bianthryl derivative such as 10,10'-diphenyl 9,9'-dianthracene, a pyrene derivative such as 1,3,6,8-tetraphenylpyrene, a carbazole derivative such as 4,4'-di (N-carbazolyl)biphenyl, an oxazole derivative such as 4,4'-bis(5-methylbenzoxazole-2-yl)stilbene, a stilbene derivative such as 4,4'-bis(2,2-diphenylethenyl)biphenyl, or the like can be used. Alternatively, a material with a high electron transporting property may be used, for example, typical metal complexes such as tris(8-quinolinolato)aluminum (abbrev., $Alq_3$), tris(4-methyl-8-quinolinolato)aluminum (abbrev., $Almq_3$), bis(10-hydroxybenzo[h]-quinolinato)beryllium (abbrev., $BeBq_2$), bis(2-methyl-8-quinolinolato)-(4-hydroxy-biphenylyl)-aluminum (abbrev., BAlq), bis[2-(2-hydroxyphenyl)-benzoxazolato]zinc (abbrev., $Zn(BOX)_2$), and bis[2-(2-hydroxyphenyl)-benzothiazolato]zinc (abbrev., $Zn(BTZ)_2$) can be used. Further, a triazole derivative such as 3-(4-tert-buthylphenyl)-4-(4-ethylphenyl)-5-(4-biphenylyl)-1,2,4-triazole, a phenanthroline derivative such as bathophenanthroline or bathocuproine may be used. Alternatively, a high molecular material compound such as poly(N-vinylcarbazole) or poly(phenylenevinylene) may be used.

Note that it is preferable that the HOMO (highest occupied molecular orbital) level of the material with a high carrier transporting property is lower than that of the material with a high luminous quantum yield, and the LUMO (lowest unoccupied molecular orbital) level of the material with a high carrier transporting property is higher than that of the material with a high luminous quantum yield. For example, it is preferable that the HOMO level of the material with a high carrier transporting property is from −5.3 eV to −6.0 eV, and that the LUMO level thereof is −2.0 eV to −2.6 eV.

As the material having a high luminous quantum yield, either a fluorescence emitting material or a phosphorescent light emitting material can be used. As the light emitting material, specifically, a coumarin derivative such as coumarin 6 or coumarin 545T, a quinacridone derivative such as N,N'-dimethyl quinacridone or an acridone derivative such as N,N'-diphenyl quinacridone, N-phenylacridone or N-methyl acridone, a condensed aromatic compound such as rubrene, 9,10-diphenylanthracene, or 2,5,8,11-tetra-t-butylperylene, a pyran derivative such as 4-dicyanomethylene-2-[p-(dimetylamino)styryl]6-methyl-4H-pyran, and an amine derivative such as 4-(2,2-diphenylvinyl)triphenylamine can be used. As the phosphorescent light emitting material, an iridium complex such as bis{2-(4-tolyl)pyridinato}acetylacetonato iridium(III), bis{2-(2'-benzothienyl)pyridinato}acetylacetonato iridium(III), or bis[2-(4,6-difluorophenyl)pyridinato]picolinato iridium(III), a platinum complex such as 2,3,7,8,12,13,17,18-octaethyl-21H,23H-porphyrin-platinum complex, and a rare-earth complex such as 4,7-diphenyl-1,10-phenanthroline-tris(2-thenoyltrifluoroacetonato)europium(III); can be used.

Note that light emission of a desired color can be obtained by properly combining the above materials. For example, a light emitting element which emits white light can be obtained by combining a material which emits light of blue to green, such as a coumarin derivative, a quinacridone derivative, an acridone derivative, 9,10-diphenylanthracene, 2,5,8,11-tetra-t-butylperylene, 4-(2,2-diphenylvinyl)triphenylamine, and a material which emits light of red to yellow light, such as rubrene, a pyran derivative, 2,3,7,8,12,13,17,18-octethyl-21H,23H-porphyrin-platinum complex, 4,7-diphenyl-1,10-phenanthroline tris(2-thenoyl trifluoro acetonato)europium(III).

By adding the material with a high luminous quantum yield to the material with a high carrier transporting property, a light emitting region is formed. The light emitting region of the light emitting element according to the present invention has a structure where regions in which the concentration of the material with a high carrier transporting property is high and regions in which the material with a high luminous quantum yield is dispersed into the material with a high carrier transporting property are laminated alternately. Namely, the light emitting region of the light emitting element has a structure in which the concentration of the material with a high luminous quantum yield included in the material with a high carrier transporting property is periodically changed. Specifically, the material with a high luminous quantum yield is added to the region in which the material with a high luminous quantum yield is dispersed in the material with a high carrier transporting property at a rate of 0.001 wt % to 50 wt %, preferably, 0.03 wt % to 30 wt %.

Note that the regions in which the concentration of the material with a high carrier transporting property is high and the regions in which the material having a high luminous quantum yield is dispersed in the material with a high carrier transporting property are laminated alternately. The thickness of each region is preferably 20 nm or less, more preferably, 5 nm or less.

Alternatively, instead of dispersing the material with a high luminous quantum yield in the material with a high carrier transporting property, a region in which the concentration of the material with a high luminous quantum yield is high may be formed. Namely, the light emitting region of the light emitting element may have a structure where regions in which the concentration of the material with a high luminous quantum yield is high and regions in which the concentration of the material with a high carrier transporting property is high are laminated alternately. Also in this case, the concentration of the material having a high luminous quantum yield periodically changes in the structure.

The regions in which the concentration of the material with a high carrier transporting property is high and the regions in which the concentration of the material with a high luminous quantum yield is high are laminated alternately. Each of the regions preferably has a thickness of 20 nm or less, more preferably, 5 nm or less.

Here, as a combination of the material with a high carrier transporting property and the material with a high luminous quantum yield, it is necessary that the HOMO (highest occupied molecular orbital) level of the material with a high luminous quantum yield is higher than HOMO level of the material with a high carrier transporting property, and the LUMO (lowest unoccupied molecular orbital) level of the material with a high luminous quantum yield is lower than the LUMO level of the material with a high carrier transporting property. When this condition is satisfied, the multiple quantum well structure can be formed.

Further, when a phosphorescent light emitting material is used as the material with a high luminous quantum yield, the triplet level of the phosphorescent light emitting material is required to be lower than the triplet level of the material having a high carrier transporting property.

Further, it is preferable that the emission spectrum of the material having a high carrier transporting property overlaps the absorption spectrum of the material having a high luminous quantum yield. In particular, when the overlap between the range of the wavelengths of the light emission of the material having a high carrier transporting property and the range of the wavelengths of the absorption of the material having a high luminous quantum yield is large, energy transfers more efficiently from the material having a high carrier transporting property to the material having a high luminous quantum yield, which is preferable.

Figure 3A:
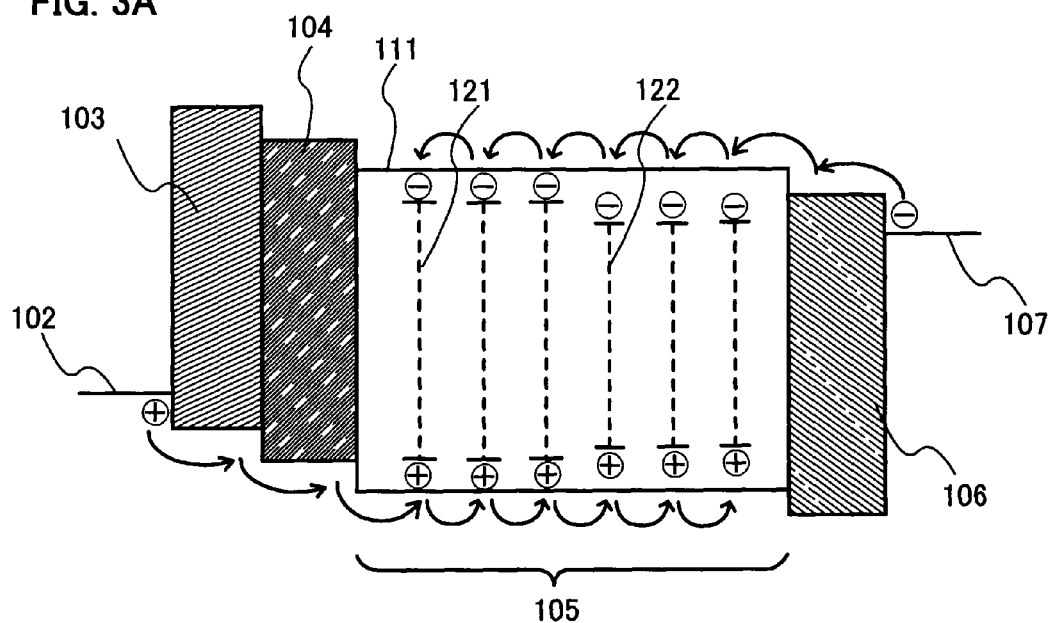
FIGS. 3A and 3B are diagrams describing a light emitting element of the present invention.
Figure 3B:
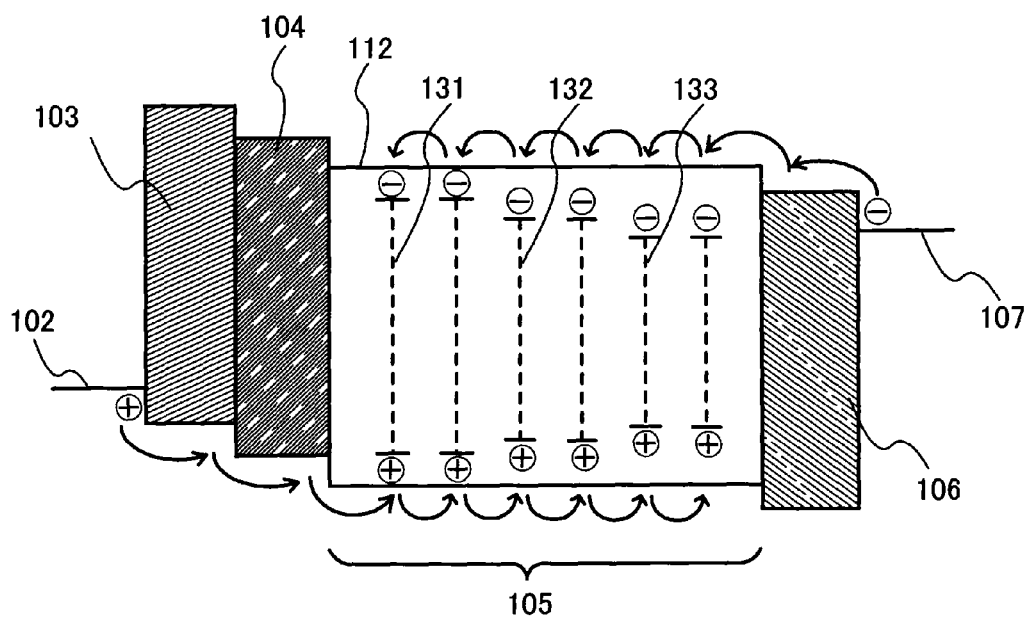

The energy level of a light emitting element of the present invention is described in more detail. Each of FIGS. 3A and 3B shows a schematic diagram of an energy level of the light emitting element according to the present invention. In FIGS. 3A and 3B, holes injected from a first electrode 102 is transported to a third layer 105, which is a light emitting region, via a first layer 103 containing a material with a high hole injecting property and a second layer 104 containing a material with a high hole transporting property. Electrons injected from a second electrode 107 are transported to the third layer 105 which is a light emitting region via a fourth layer 106 containing a material with a high electron transporting property. In the third layer 105, the holes and the electrons are recombined to emit light. The third layer 105 has a multiple quantum well structure and contains a material with a high luminous quantum yield and a material with a high carrier transporting property.

In order to improve the luminous efficiency of the light emitting element, balance between electrons and holes injected into the light emitting region is important. In order to improve the luminous efficiency, it is preferable that nearly the same number of electrons and holes are injected and either one of the electrons and holes do not exceed the other. Furthermore, the electrons and the holes injected into the light emitting region are desirably recombined efficiently. Further, reducing the number of the electrons which reach an anode without being recombined in the light emitting region and the number of the holes which reach a cathode without being recombined in the light emitting region is also important.

Therefore, a multiple quantum well structure in which a large number of recombination regions exist in a light emitting region is preferably formed.

When the electrons and the holes are trapped in a well strongly, and can not move to the next well, recombination efficiency of the electrons and holes becomes low and high luminous efficiency that is an effect of the multiple quantum well structure can not be obtained. Namely, it is necessary that the electrons and the holes move to the next well without being trapped in one well. Therefore, it is important that the depth of the well and the height of the barrier are optimized in view of the HOMO level and the LUMO level of the material with a high carrier transporting property and the material with a high luminous quantum yield, respectively. Note that the depth of the well and the height of the barrier for electrons mean a difference between the LUMO level of the material with a high carrier transporting property and the LUMO level of the material with a high luminous quantum yield.

FIGS. 3A and 3B shows a structure where regions in which the concentration of a material (host material) with a high carrier transporting property and regions in which a material (guest material) with a high luminous quantum yield is dispersed in a material (host material) with a high carrier transporting property are laminated alternately. Namely, FIGS. 3A and 3B show a structure where regions in which the concentration of the material with a high luminous quantum yield included in the material with a high carrier transporting property is high and regions in which the concentration of the material with a high luminous quantum yield included in the material with a high carrier transporting property is low are laminated alternately. In FIGS. 3A and 3B, the region in which the concentration of the material (host material) with a high carrier transporting property is high, that is a region in which the concentration of the material with a high luminous quantum yield included in the material with a high carrier transporting property is low functions as a barrier, and a region including the material with a high luminous quantum yield at high concentration functions as a well. Holes injected into the third layer 105, which is a light emitting region, enters a region (well) in which the concentration of the material with a high luminous quantum yield is high and are recombined with electrons. Holes which have penetrated the first well enter the second well, and are recombined with electrons. Since numerous wells are formed, holes are trapped by the wells and probability of recombination with electrons is improved. The above is true of electrons. Electrons enter a region (well) in which the concentration of the material with a high carrier transporting property is high and are recombined with holes. Electrons which have penetrated the first well enter the second well, and are recombined with holes. Since numerous wells are formed, holes are trapped by the wells and probability of recombination with electrons is improved. Therefore, by improving the probability of the recombination, luminous efficiency is improved.

By using plural kinds of materials (guest material) with a high luminous quantum yield, a light emitting element with high luminous efficiency, which emits light of a desired color, can be obtained. For example, by using blue, red, and green guest materials, a light emitting element which shows white light emission as a whole can be manufactured. Furthermore, by using two kinds of guest materials which emit lights having a complementary color relationship, a light emitting element which shows white light emission can be manufactured. The light emitting element of the invention has a multiple quantum well structure, and the light emitting element which emits white light at high efficiency can be obtained.

For example, as shown in FIG. 3A, in the direction of the lamination of the light emitting element, a region in which the concentration of a material with a high carrier transporting property (host material) 111 is high and a region in which a first guest material 121 is dispersed in the host material may be laminated locally, and a region in which the concentration of the host material 111 is high and a region in which a second guest material 122 is dispersed in the host material may be laminated locally.

Figure 4A:
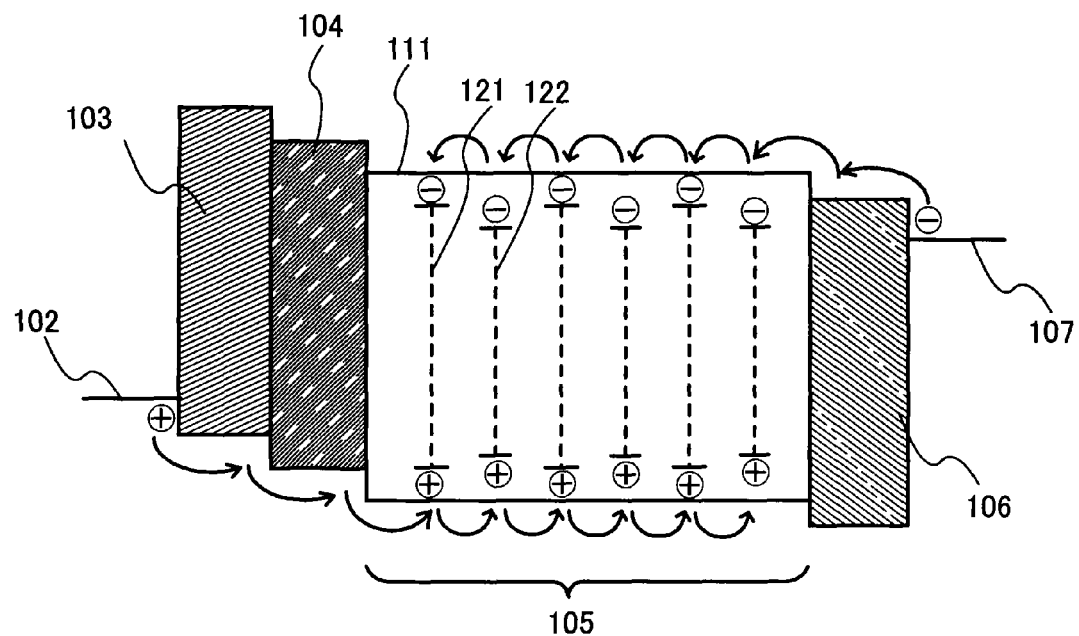
FIGS. 4A and 4B are diagrams describing a light emitting element of the present invention.

Alternatively, as shown in FIG. 4A, the structure in which the following regions are repeatedly laminated may be employed: a region in which the concentration of the host material 111 is high; a region in which the first guest material 121 is dispersed in the host material; a region in which the concentration of the host material 111 is high; and a region in which the second guest material 122 is dispersed in the host material. When the distance between the region in which the first guest material 121 is dispersed and the region in which the second guest material 122 is dispersed is close to each other as shown in FIG. 4A, it is preferable that the overlap between the emission spectrum of the first guest material and the absorption spectrum of the second guest material is small so that energy transfer from one guest material to the other guest material is prevented.

The light emitting element of the present invention is not limited to the structure using two kinds of the materials having a high luminous quantum yield, and three or more kinds of materials having a high luminous quantum yield may be used.

For example, as shown in FIG. 3B, in the direction of the lamination of the light emitting element, a host material 112 and a first guest material 131 may be laminated locally, the host material 112 and the second guest material 132 may be laminated locally, and the host material 112 and the third guest material 133 may be laminated locally.

Figure 4B:
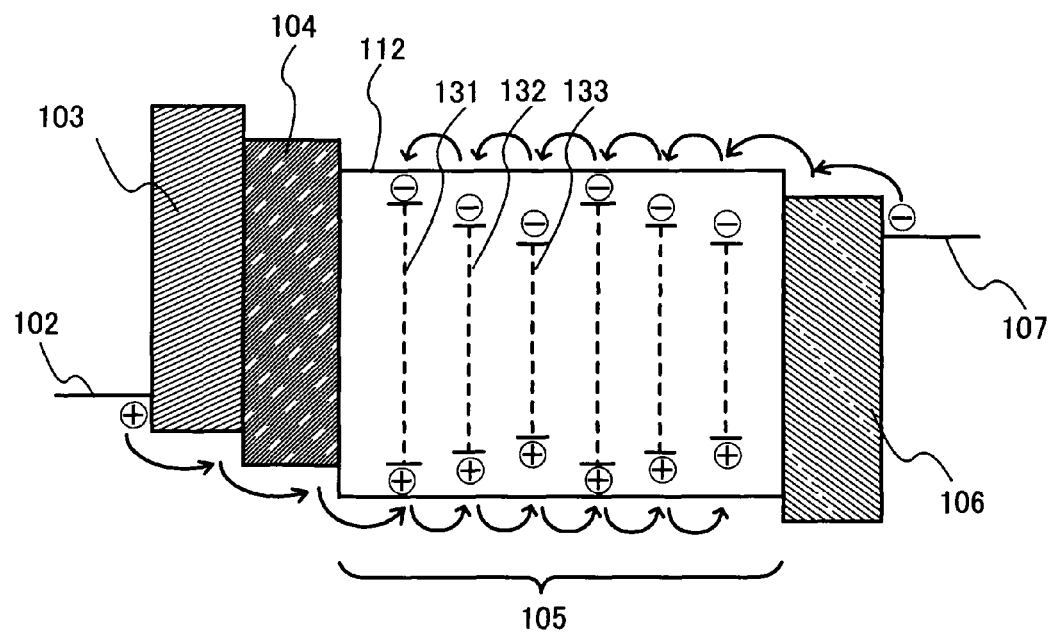

Alternatively, as shown in FIG. 4B, a structure in which the following regions are repeatedly laminated may be employed: a region in which the concentration of the host material 112 is high; a region in which the first guest material 131 is dispersed into the host material; a region in which the concentration of the host material 112 is high; a region in which the second guest material 132 is dispersed into the host material 112; a region in which the concentration of the host material 112 is high; and a region in which the third guest material 133 is dispersed into the host material 112. As shown in FIG. 4B, when the distance among the region in which the first guest material 131 is dispersed, the region in which the second guest material 132 is dispersed, and the region in which the third guest material 133 is dispersed are close to each other, it is preferable that energy transfer from one guest material to another material does not occur. To be concrete, the overlap of the emission spectrum of the first guest material and the absorption spectrum of another guest material, the overlap of the emission spectrum of the second guest material and the absorption spectrum of another guest material, and the overlap of the emission spectrum of the third guest material and the absorption spectrum of another guest material are preferably small.

In this embodiment mode, the mode in which two kinds or three kinds of the materials (guest material) with a high luminous quantum yield are used is shown; however, a light emitting region may be formed using four or more kinds of materials (guest material) with a high luminous quantum yield. Concerning the material (host material) with a high carrier transporting property, not only one kind but also plural kinds of materials with a high carrier transporting property may be used. When using a common material (host material) having a high carrier transporting property with respect to each of the materials (guest material) with a high luminous quantum yield, the manufacturing process of the light emitting element is simplified, which is preferable.

The number of the wells and the barriers in the multiple quantum well structure in the light emitting region may be properly set, and not limited to the one shown in this embodiment mode.

Embodiment Mode 2

A vapor deposition apparatus used for implementing the present invention and a method of manufacturing a light emitting region having a multiple quantum well structure using the vapor deposition apparatus are described with reference to FIGS. 10 to 16.

Figure 10:
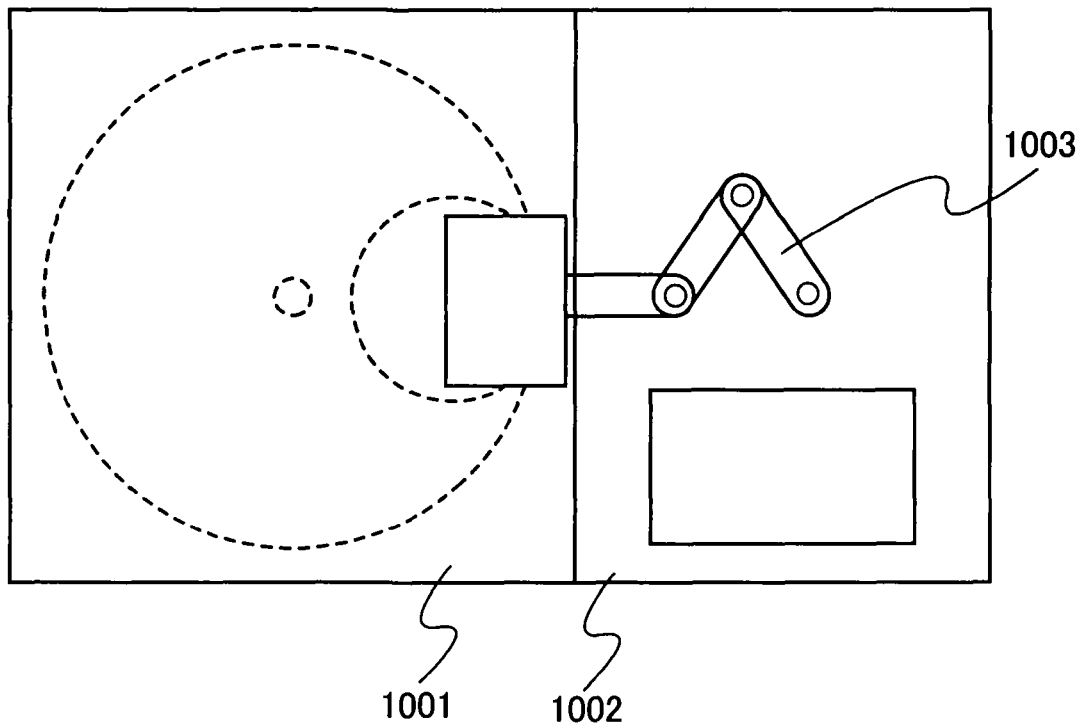
FIG. 10 is a diagram describing a method for manufacturing a light emitting element of the present invention.

In the vapor deposition apparatus used in this embodiment mode, a treatment chamber 1001 in which an object is subjected to vapor deposition and a transferring chamber 1002 are provided. The object is transferred to the treatment chamber 1001 through the transferring chamber 1002. The transferring chamber 1002 is provided with an arm 1003 for transferring the object (FIG. 10).

Figure 11:
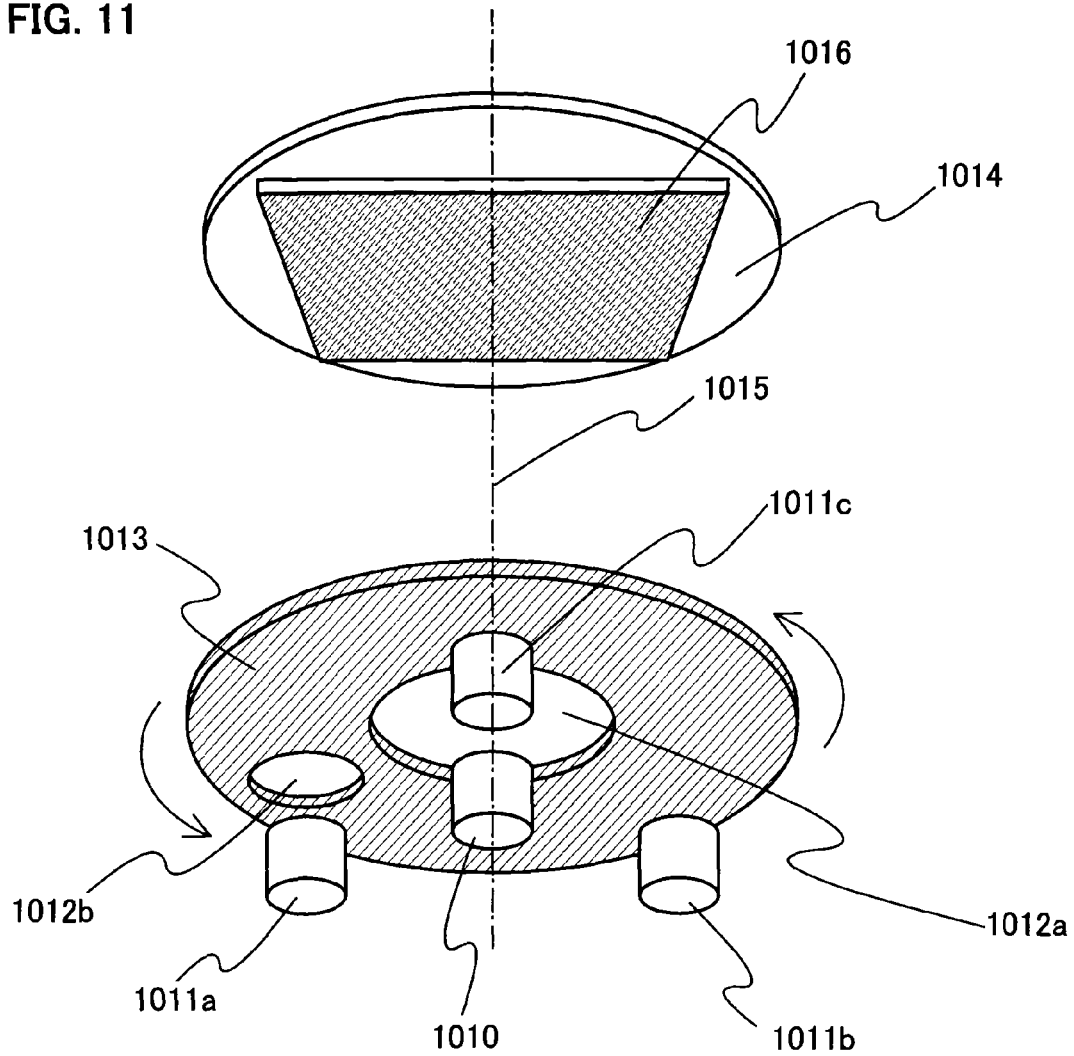
FIG. 11 is a diagram describing a method for manufacturing a light emitting element of the present invention.

In the treatment chamber 1001, as shown in FIG. 11, an evaporation source 1010 for holding a first material, an evaporation source 1011a for holding a second material, an evaporation source 1011b for holding a third material, and an evaporation source 1011c for holding a fourth material are provided so as to be opposite to a holder 1014 with a rotating plate 1013 including a first opening 1012a and a second opening 1012b interposed therebetween. The holder 1014 holds an object 1016 and is rotated around an axis 1015, thereby reducing in-plane variation such as variation in the thickness of a layer to be formed on the object.

Figure 12:
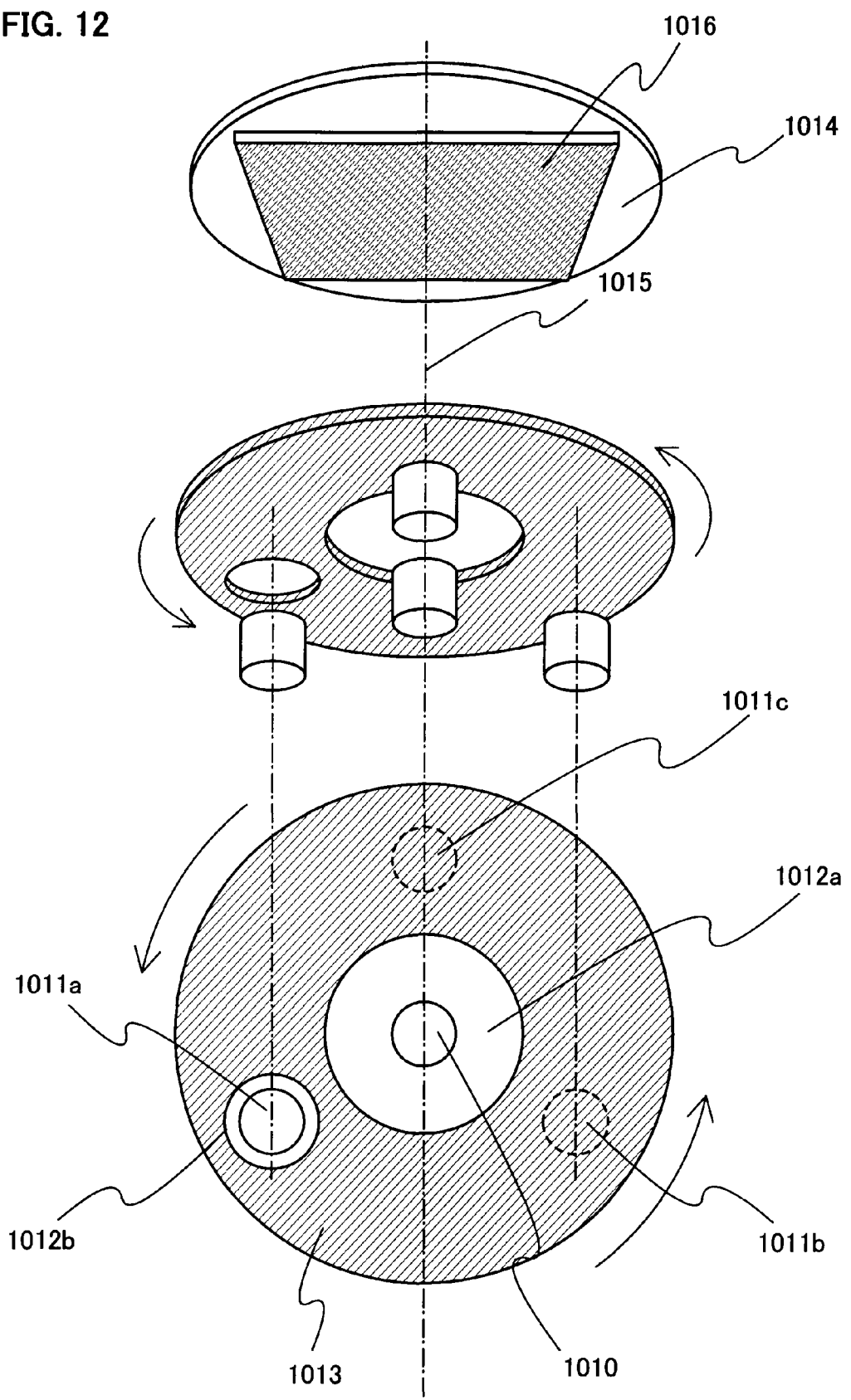
FIG. 12 is a diagram describing a method for manufacturing a light emitting element of the present invention.

The rotating plate 1013 rotates around the axis 1015; thereby the location of the second opening 1012b is changed. Since the axis 1015 penetrates the first opening 1012a, the location of the first opening 1012a is not changed when the rotating plate 1013 rotates. In FIG. 12, a top view of the rotating plate 1013 in FIG. 11 is shown on the same diagram.

When the second opening 1012b locates closer to the evaporation source 1011a than to the evaporation source 1011b and to the evaporation source 1011c, each material is diffused from the second opening 1012b to the holder 1014 in a state where the concentration of the second material is higher that those of the third material and the fourth material. And each material is evaporated on the object 1016 held by the holder 1014 in such a manner that the second material has higher concentration than the third material and the fourth material.

When the rotating plate 1013 rotates and the second opening 1012b locates so as to be closer to the evaporation source 1011b than to the evaporation source 1011a and to the evaporation source 1011c, each material is evaporated on the object 1016 so that the third material has higher concentration than the second material and the fourth material.

When the rotating plate 1013 rotates and the second opening 1012b locates so as to be closer to the evaporation source 1011c than to the evaporation source 1011a and to the evaporation source 1011b, each material is evaporated on the object 1016 so that the fourth material has higher concentration than the second material and the third material.

Since the location of the first opening is not changed even when the rotating plate 1013 rotates, the first material is evaporated on the object 1016 all the time.

According to the above method, a region in which the concentration of the first material is high; a region in which the second material is dispersed in the first material; a region in which the concentration of the first material is high; a region in which the third material is dispersed in the first material; a region in which the concentration of the first material is high; and a region in which the fourth material is dispersed in the first material can be laminated sequentially.

In a structure shown in FIG. 11 and FIG. 12, when the rotation speed of the rotating plate 1013 is increased, the width of each region in the direction of the lamination becomes short. In other words, the film thickness of each region becomes small. On the other hand, when the rotation speed of the rotating plate 1013 is decreased, the width in the direction of the lamination of each region becomes long. In other words, the film thickness of the each region becomes large.

At this time, the holder 1014 for holding the object 1016 may rotate around the same axis as the axis 1015 of the rotating plate. In this case, rotating direction may be the same as the rotating direction of the rotating plate or the reversed direction. However, when the rotating directions are the same, rotation speeds of the holder 1014 and the rotating plate 1013 are preferably different from each other.

Figure 13:
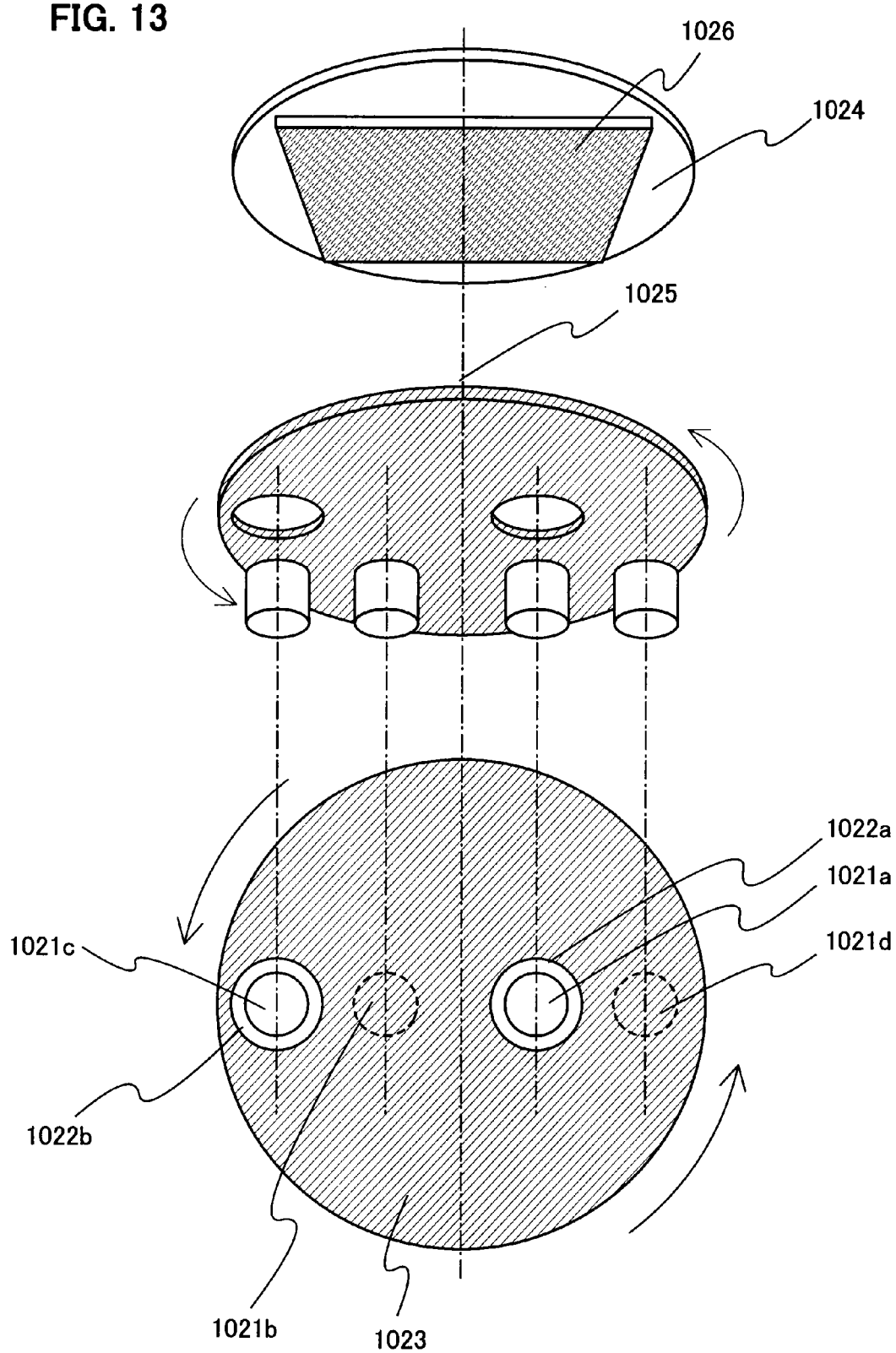
FIG. 13 is a diagram describing a method for manufacturing a light emitting element of the present invention.

The structure in the treatment chamber 1001 is not limited to those shown in FIG. 11 and FIG. 12, and the structure as shown in FIG. 13 may be applied. In FIG. 13, an evaporation source 1021a in which a first material is held, an evaporation source 1021b in which a second material is held, an evaporation source 1021c in which a third material is held, and an evaporation source 1021d in which a fourth material is held are provided so as to be opposite to a holder 1024 with a rotating plate 1023 provided with a first opening 1022a and a second opening 1022b interposed therebetween. The rotating plate 1023 rotates around an axis 1025, and the locations of the first opening 1022a and the second opening 1022b are changed by the rotation. Note that the first opening 1022a and the second opening 1022b are provided so that the trajectories of the first opening 1022a and the second opening 1022b do not overlap each other when the first opening 1022a and the second opening 1022b are rotated around the axis 1025.

When the first opening 1022a locates closer to the evaporation source 1021a than to the evaporation source 1021b, the second opening 1022b locates closer to the evaporation source 1021c than to the evaporation source 1021d. At this time, the materials are dispersed from the first opening 1022a and from the second opening 1022b in the condition that the concentration of the first material is higher than that of the second material and in the condition that the concentration of the third material is higher than that of the fourth material respectively, and each material is evaporated on the object 1026 which is held by the holder 1024. Namely, each material is evaporated so that the concentration of the first material is higher than that of the second material and the concentration of the third material is higher than the fourth material.

When the first opening 1022a locates closer to the evaporation source 1021b than the evaporation source 1021a, the second opening 1022b locates closer to the evaporation source 1021d than the evaporation source 1021c. At this time, the materials are dispersed from the first opening 1022a and from the second opening 1022b in the condition that the concentration of the second material is higher than that of the first material and in the condition that the concentration of the fourth material is higher than that of the third material respectively, and each material is evaporated on the object 1026 which is held by the holder 1024. Namely, each material is evaporated so that the concentration of the second material is higher than that of the first material and the concentration of the fourth material is higher than the third material.

At this time, the holder 1024 for holding the object 1026 may rotate around the same axis as the axis 1025 of the rotating plate. In this case, the rotating direction may be the same as the rotating direction of the rotating plate or the reversed direction. However, when the rotating directions are the same, rotation speeds of the holder 1024 and the rotating plate 1023 are preferably different from each other.

According to the above method, a region in which the concentration of the first material is high; a region in which the third material is dispersed in the first material; a region in which the concentration of the first material is high; a region in which the concentration of the second material is high; a region in which the fourth material is dispersed in the second material; and a region in which the concentration of the second material is high can be sequentially formed.

Figure 14:
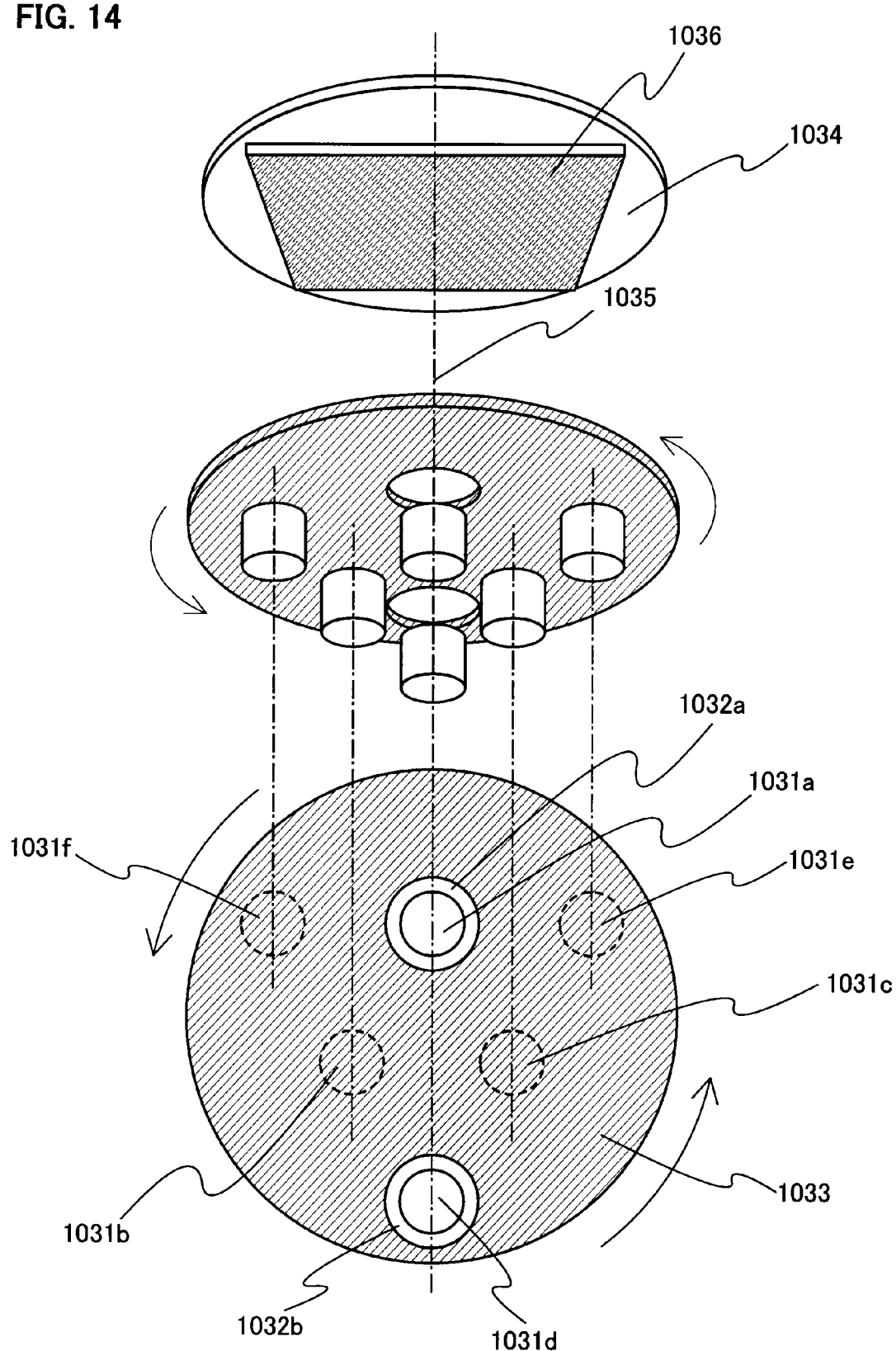
FIG. 14 is a diagram describing a method for manufacturing a light emitting element of the present invention.

Also in the case where the number of evaporation sources is increased, regions in each of which a material has high concentration can be sequentially formed. In FIG. 14, an evaporation source 1031a holding a first material, an evaporation source 1031b holding a second material, an evaporation source 1031c holding a third material, an evaporation source 1031d holding a fourth material, an evaporation source 1031e holding a fifth material, an evaporation source 1031f holding a sixth material are provided so that each of the evaporation sources is opposite to a holder 1034 with a rotating plate 1033 including a first opening 1032a and a second opening 1032b interposed therebetween. The rotating plate 1033 rotates around an axis 1035, and the locations of the first opening 1032a and the second opening 1032b are changed by the rotation. Note that the first opening 1032a and the second opening 1032b are provided so that the trajectories of the first opening 1032a and the second opening 1032b do not overlap each other when the first opening 1032a and the second opening 1032b are rotated around the axis 1035.

When the first opening 1032a locates closer to the evaporation source 1031a than to the evaporation source 1031b and to the evaporation source 1031c, the second opening 1032b locates closer to the evaporation source 1031d than to the evaporation source 1031e and to the evaporation source 1031f. At this time, the materials are dispersed from the first opening 1032a and from the second opening 1032b in the condition that the concentration of the first material is higher than those of the second material and the third material and in the condition that the concentration of the fourth material is higher than those of the fifth material and the sixth material respectively, and each material is evaporated on the object 1036 which is held by the holder 1034. In other words, each material is evaporated so that the first material has higher concentration than the second material and the third material and that the fourth material has higher concentration than the fifth material and the sixth material.

When the first opening 1032a locates closer to the evaporation source 1031b than the evaporation source 1031a and the evaporation source 1031c, the second opening 1032b locates closer to the evaporation source 1031e than the evaporation source 1031d and the evaporation source 1031f. At this time, the materials are dispersed from the first opening 1032a and from the second opening 1032b in the condition that the second material has higher concentration than the first material and the third material and in the condition that the fifth material has higher concentration than the fourth material and the sixth material respectively, and each material is evaporated on the object 1036 which is held by the holder 1034. In other words, each material is evaporated so that the second material has higher concentration than the first material and the third material, and that the fifth material has higher concentration than the fourth material and the sixth material.

When the first opening 1032a locates closer to the evaporation source 1031c than to the evaporation source 1031a and to the evaporation source 1031b, the second opening 1032b locates closer to the evaporation source 1031f than to the evaporation source 1031d and to the evaporation source 1031e. At this time, the materials are dispersed from the first opening 1032a and from the second opening 1032b in the condition that the third material has higher concentration than the first material and the second material and in the condition that the sixth material has higher concentration than the fourth material and the fifth material respectively, and each material is evaporated on the object 1036 which is held by the holder 1034. In other words, each material is evaporated so that the third material has higher concentration than the first material and the second material, and the sixth material has higher concentration than the fourth material and the fifth material.

At this time, the holder 1034 for holding the object 1036 may rotates around the same axis as the axis 1035 of the rotating plate. In this case, the rotating direction of the holder 1034 may be the same as the rotating direction of the rotating plate or the reversed direction. However, when the rotating directions are the same, rotation speeds of the holder 1034 and the rotating plate is preferably different from each other.

According to the above method, a region in which the concentration of the first material is high; a region in which the fourth material is dispersed into the first material; a region in which the concentration of the first material is high; a region in which the concentration of the second material is high; a region in which the fifth material is dispersed in the second material; a region in which the concentration of the second material is high; a region in which the concentration of the third material is high; a region in which the sixth material is dispersed in the third material; and a region in which the concentration of the sixth material is high can be formed sequentially.

Figure 15:
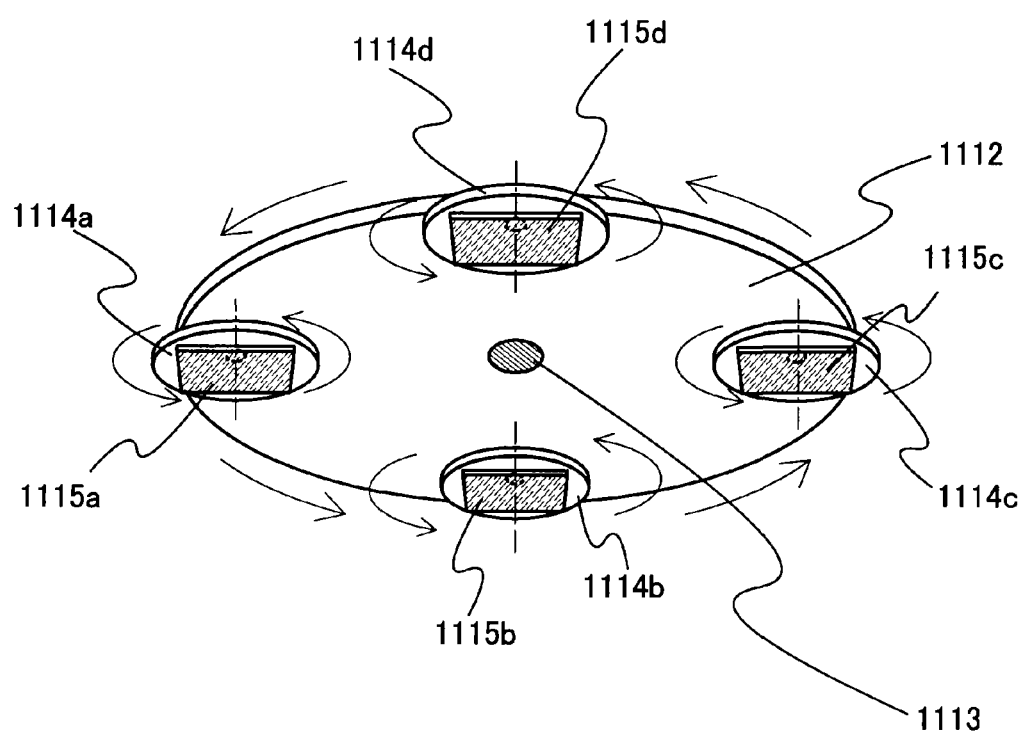
FIG. 15 is a diagram describing a method for manufacturing a light emitting element of the present invention.
Figure 16:
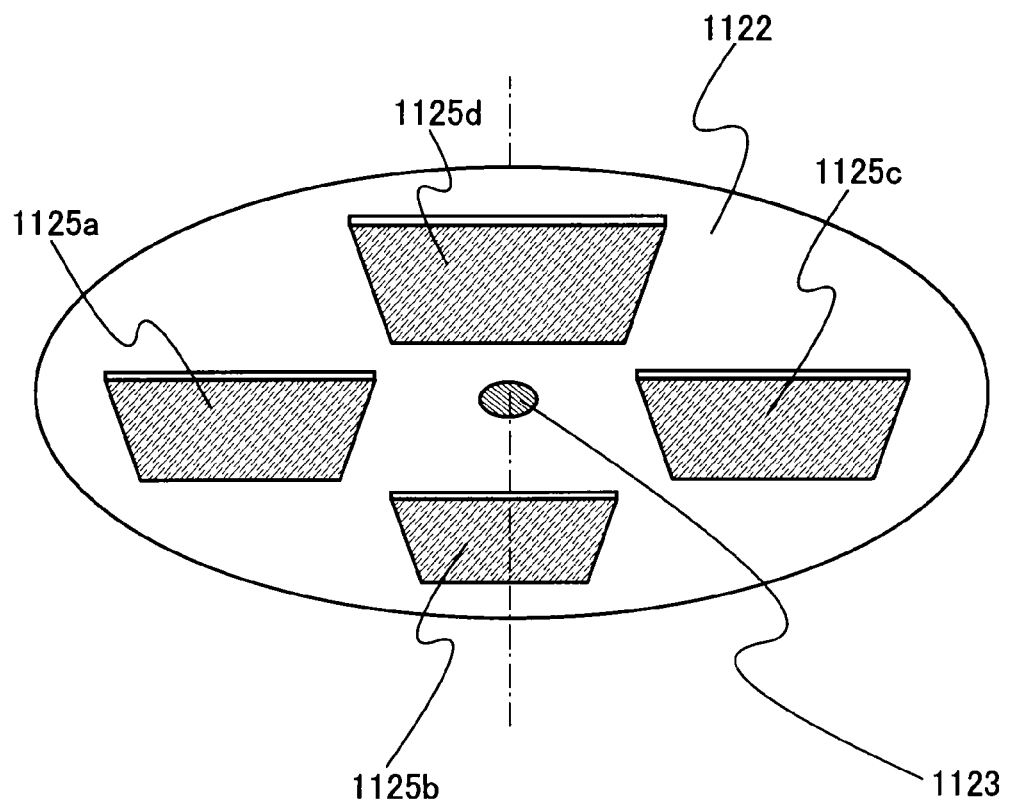
FIG. 16 is a diagram describing a method for manufacturing a light emitting element of the present invention.

Note that the holder for holding the object is not limited to those shown in FIGS. 11 to 14, and structures shown in FIGS. 15 and 16 may be used.

In FIG. 15, a holder for holding the object includes a first rotating plate 1112 which rotates around an axis 1113, and second rotating plates 1114a to 1114d provided on the first rotating plate 1112. Note that the axis 1113 is preferably the same axis as a rotation axis of the rotating plate having an opening shown in FIGS. 11 to 14. The second rotating plates 1114a to 1114d rotate independently around an axis provided for each of the second rotating plates 1114a to 1114d, separately from the axis 1113. Objects 1115a to 1115d are held by the second rotating plates 1114a to 1114d, respectively.

In FIG. 15, the second rotating plate 1114a holds an object 1115a, the second rotating plate 1114b holds an object 1115b, the second rotating plate 1114c holds an object 1115c, and the second rotating plate 1114d holds an object 1114d.

In a structure shown in FIG. 15, the first rotating plate and the second rotating plates may rotate independently. For example, vapor deposition may be performed while rotating only the first rotating plate.

Furthermore, the shape of the first rotating plate 1112 and the second rotating plates 1114a to 1114d are not specifically limited, and may be a polygon such as a quadrangle other than a circular form as shown in FIG. 15. Moreover, the second rotating plates 1114a to 1114d are not necessarily provided; however, in-plane variation such as variation in the thickness of a layer to be formed on the object can be decreased.

In the structure shown in FIG. 16, a holder 1122 holds objects 1125a to 1125d. The holder 1122 rotates around an axis 1123. In addition, it is preferred that the axis 1123 is the same as the rotation axis of the rotating plate having openings shown in FIGS. 11 to 14.

Note that the structure of the vapor deposition apparatus is not limited to the one shown in FIG. 10, and for example, a structure having a sealing chamber for sealing a light emitting element may be employed. Further, the number of the treatment chambers for performing vapor deposition is not required to be one, and two or more treatment chambers may be provided.

The rotational directions of the holder for holding the object and the rotational direction of the rotating plate having the opening may be the same or different from each other. However, when the directions of the rotation are the same, rotation speeds are preferably different from each other The rates of the vapor deposition during vaporization may be the same or different depending on materials.

Note that the width in a lamination direction of each region, that is the film thickness of each region differs depending on the distance between an object and an evaporation source, the distance between evaporation sources, the distance between the substrate and a rotation axis, and the like as well as the rotation speed of the substrate and the deposition rate; therefore, optimum values may be set appropriately for each apparatus. Note that, depending on the size of the substrate, the distance between the evaporation sources is preferably about twice the distance between the center of the substrate and the rotation axis. For example, in the case of using a 12 cm×12 cm substrate, by setting the distance between the substrate and the evaporation source at 20 cm to 40 cm, the distance between the evaporation sources at 15 cm to 30 cm, the distance between the center of the substrate and the rotation axis at 8 cm to 15 cm, the deposition rate at 0.2 to 2.0 nm/s, and the rotation speed at 2 rpm to 20 rpm, a multiple quantum well structure can be formed.

When a multiple quantum well structure is formed, a method of forming each region by opening and closing a shutter which locates between the evaporation source and the object (substrate) can be applied. However, according to the method of the present invention, a multiple quantum well structure can be formed more easily. Thus, a light emitting element having a multiple quantum well structure with preferable throughput can be manufactured.

Embodiment Mode 3

In this embodiment mode, a light emitting element of the present invention is described.

The light emitting element of the present invention has plural layers between a pair of electrodes. The plural layers are laminated by combining layers composed of substances with a high carrier injection property and a high carrier transporting property so that a light emitting region is formed away from the electrodes, namely so that recombination of carriers is performed in a region which is away from the electrodes. The light emitting element of the present invention has a multiple quantum well structure in a light emitting region.

A mode of the light emitting element according to the present invention is described with reference to FIG. 1A.

In this embodiment mode, the light emitting element includes a first electrode 102, the following layers sequentially laminated over the first electrode 102: a first layer 103, a second layer 104, a third layer 105, and a fourth layer 106, and a second electrode 107 formed thereover. In this embodiment mode, explanation is provided hereinafter supposing that the first electrode 102 functions as an anode and the second electrode 107 functions as a cathode.

A substrate 101 is used as a support body of the light emitting element. As the substrate 101, for example, glass, plastic, or the like can be used. If the substrate functions as a support body of the lithe emitting element in a manufacturing process, a material other than glass or plastic may be used.

The first electrode 102 may be formed by using various materials, preferably, metals with a high work function (to be more precise, 4.0 eV or more), alloys, conductive compounds, or a mixture of such materials. For example, the first electrode 102 may be formed by using indium tin oxide (ITO); indium tin oxide containing silicon; IZO (Indium Zinc Oxide) obtained by mixing indium oxide with 2 to 20 wt % of zinc oxide (ZnO); indium oxide containing 0.5 to 5 wt % of tungsten oxide and 0.1 to 1 wt % of zinc oxide (IWZO); or the like. Although these conductive metal oxide films are generally formed by sputtering, it may be formed by applying a sol-gel method or the like. Alternatively, the first electrode 102 may be formed by using gold (Au), platinum (Pt), nickel (Ni), tungsten (W), chromium (Cr), molybdenum (Mo), iron (Fe), cobalt (Co), copper (Cu), palladium (Pd), nitride of a metal material such as titanium nitride (TiN), or the like.

The first layer 103 includes a material having a high hole injection property. Molybdenum oxide (MoOx), vanadium oxide (VOx), ruthenium oxide (RuOx), tungsten oxide (WOx), manganese oxide (MnOx), or the like can be used for the first layer 103. In addition, the first layer 103 can be formed of a compound of a phthalocyanine compound such as phthalocyanine (abbrev., $H_2Pc$) or copper phthalocyanine (CuPC), or a high molecular compound such as poly (ethylene dioxythiophene)/poly(styrene sulfonate) (PEDOT/PSS).

The first layer 103 may be a layer containing a composite material of an organic compound and an inorganic compound. In particular, the composite material containing an organic compound and an inorganic compound showing an electron-accepting property to the organic compound donates and accepts electrons between the organic compound and the inorganic compound. Since the carrier density is increased, the composite material has an excellent a hole injection property and a hole transporting property. In this case, a material superior in transporting holes is preferable for an organic compound. Specifically, an aromatic amine organic compound or a carbazole organic compound is preferably used. A material showing an electron accepting property to the organic compound, preferably, an oxide of transition metals is used. For example, metal oxide such as titanium oxide (TiOx), vanadium oxide (VOx), molybdenum oxide (MoOx), tungsten oxide (WOx), rhenium oxide (ReOx), ruthenium oxide (RuOx), chromium oxide (CrOx), zirconium oxide (ZrOx), hafnium oxide (HfOx), tantalum oxide (TaOx), silver oxide (AgOx), and manganese oxide (MnOx) can be used. When the composite material containing an organic compound and an inorganic compound is used for the first layer 103, an ohmic contact with the first electrode 102 becomes possible. Therefore, a material for forming the first electrode can be selected regardless of a work function.

The second layer 104 is preferably a layer formed of a material having a high hole transporting property, specifically, an aromatic amine compound (i.e., s compound having benzene ring-nitrogen bonds). For example, a starburst aromatic amine compound such as 4,4'-bis[N-(3-methylphenyl)-N-phenylamino]-biphenyl; a derivative thereof: 4,4'-bis[N-(1-naphthyl)-N-phenylamino]biphenyl (abbrev., NPB); 4,4',4"-tris(N,N-diphenyl-amino)-triphenylamine; or 4,4',4"-tris[N-(3-methylphenyl)-N-phenylamino]triphenylamine can be used. Each material described herein mainly has a hole mobility of $10^{-6}$ cm$^2$/Vs or higher. Note that other materials may be used as long as they have a hole transporting property higher than an electron transporting property. Note that the second layer 104 is not limited to a single layer, but may be a mixed layer or a lamination film having two or more layers formed of the aforementioned materials.

The third layer 105 is a light emitting region having a multiple quantum well structure described in Embodiment 1. Specifically, a material which has a high carrier transporting property and a material which has a high luminous quantum yield are combined to form the structure.

The fourth layer 106 is a layer formed of a material having a high electron transporting property, for example, a typical metal complex such as tris(8-quinolinolato)aluminum (abbrev., $Alq_3$); tris(4-methyl-8-quinolinolato)aluminum (abbrev., $Almq_3$); bis(10-hydroxybenzo[h]quinolinato)beryllium (abbrev., $BAlq_2$); bis[2-(2-hydroxyphenyl) benzoxazolato]zinc (abbrev., $Zn(BOX)_2$); or bis[2-(2-hydroxyphenyl)benzothiazolato]zinc (abbrev., $Zn(BTZ)_2$) may be used. A hydrocarbon compound such as 9,10-diphenylanthracene or 4,4'-bis(2,2-diphenylethenyl)biphenyl is also favorable. Alternatively, triazole derivatives such as 3-(4-tert-butylphenyl)-4-(4-ethylphenyl)-5-(4-biphenylyl)-1,2,4-triazole, or phenanthroline derivatives such as bathophenanthroline or bathocuproin may be used. Each material described herein mainly has an electron mobility of $10^{-6}$ $cm^2/Vs$ or higher. Note that another material may be used for the fourth layer 106 as long as they have an electron transporting property higher than a hole transporting property. Note that the fourth layer 106 is not limited to a single layer, but may be a mixed layer or a lamination film having two or more layers formed of the aforementioned substances.

The second electrode 107 may be formed of a material having a low work function (3.8 eV or lower) such as a metal, an alloy, an electrically conductive compound, or a mixture of them. As a specific example of such a cathode material, there are metals belonging to the group 1 or 2 of the periodic table, namely alkali metals such as lithium (Li) or cesium (Cs), alkaline earth metals such as magnesium (Mg), calcium (Ca), or strontium (Sr), alloys containing such metals (MgAg or AlLi), a rare earth metals such as europium (Eu) or ytterbium (Yb) or alloys or the like containing these. However, by providing a layer having a function to promote electron injection on the second electrode 107 between the second electrode 107 and the fourth layer 106, various conductive materials such as Al, Ag, ITO, or ITO containing silicon can be used for the second electrode 107 regardless of the value of the work function.

Note that the layer having a function to promote electron injection includes a compound of alkali metals such as lithium fluoride (LiF) or cesium fluoride (CsF) or a compound of alkaline earth metals such as calcium fluoride ($CaF_2$). Alternatively, the second electrode 107 may be formed from a layer formed of a material having an electron transporting property into which an alkali metal or an alkaline earth metal is mixed, for example, $Alq_3$ in which magnesium (Mg) or lithium (Li) is mixed may be used.

The first layer 103, the second layer 104 and the fourth layer 106 may be formed by a known method such as vapor deposition, an ink-jet method, or a spin coating. In addition, different vapor deposition methods may be used for forming the respective electrodes or layers. Note that the third layer 105 is preferably formed by a method described in Embodiment 2.

In the light emitting element of the invention which has the aforementioned structure, current flows in accordance with a potential difference generated between the first electrode 102 and the second electrode 107, thereby holes and electrons are recombined in the third layer 105 which is a layer containing a material having a high light emitting property; thus, light emission is obtained. In other words, a light emitting region is formed in the third layer 105.

Figure 1B:
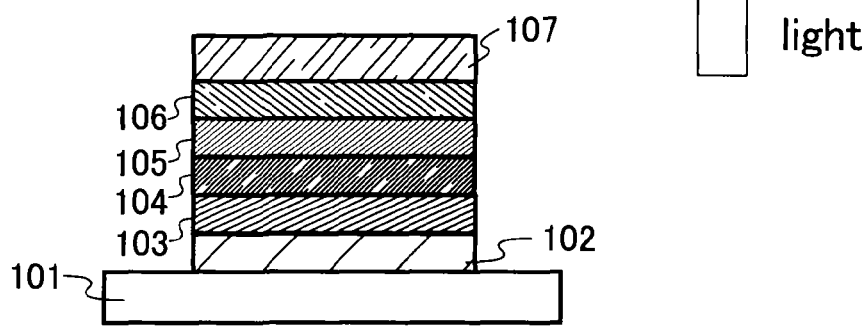
Figure 1C:
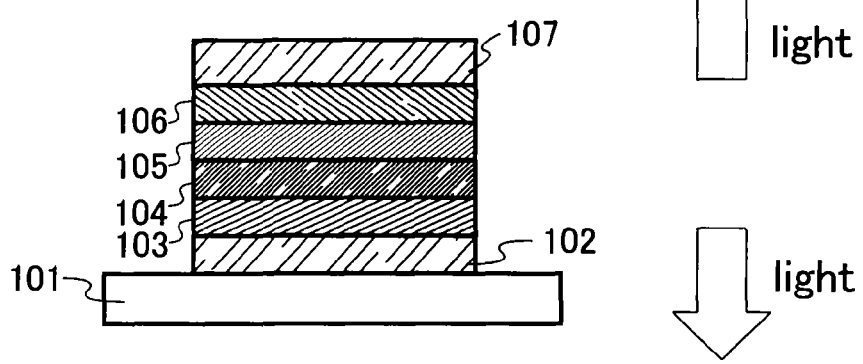

Light emitting is extracted to the outside through one or both of the first electrode 102 and the second electrode 107. Accordingly, one or both of the first electrode 102 and the second electrode 107 is formed of a light-transmitting substance. In the case where only the first electrode 102 is formed of a light-transmitting substance, light is emitted from the substrate side through the first electrode 102 as shown in FIG. 1A. Alternatively, in the case where only the second electrode 107 is formed of a light-transmitting substance, light is emitted from the opposite side of the substrate through the second electrode 107 as shown in FIG. 1B. Further alternatively, in the case where both the first electrode 102 and the second electrode 107 are formed of a light-transmitting substance, light is emitted from both the substrate side and the opposite side of the substrate through the first electrode 102 and the second electrode 107 as shown in FIG. 1C.

Note that the structure of the layers provided between the first electrode 102 and the second electrode 107 is not limited to the above. Any other structure may be employed as long as a light emitting region having a multiple quantum well structure in which holes and electrodes are recombined is provided away from the first electrode 102 and the second electrode 107 in order to prevent light quenching which would be caused when the light emitting region is located close to a metal.

In other words, the lamination structure of the layers is not specifically limited, and a layer containing a composite material of the invention may be freely combined with a layer formed of a material with a high electron transporting property, a material with a high hole transporting property, a material with a high electron injecting property, a material with a high hole injecting property, a material having a bipolar property (material having both a high electron transporting property and a high hole transporting property), and the like.

Figure 2:
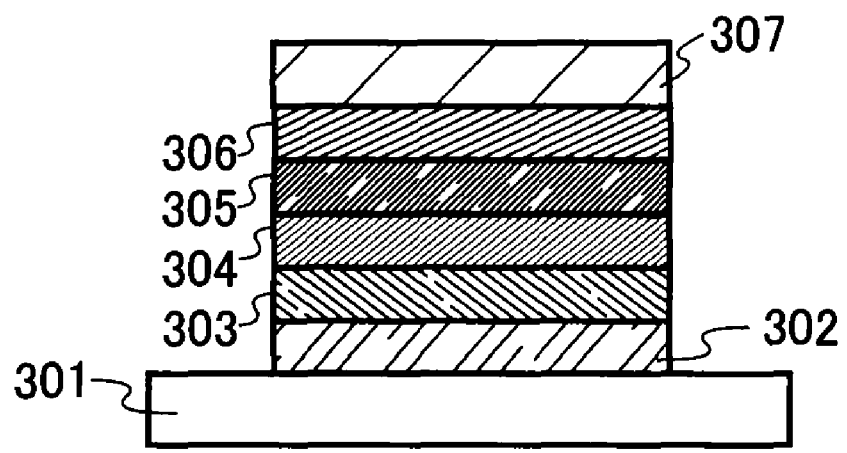
FIG. 2 is a diagram describing a light emitting element of the present invention.

The light emitting element shown in FIG. 2 has a structure in which a first electrode 302 functioning as a cathode, a first layer 303 formed of a material with a high electron transporting property, a second layer 304 containing a material with a high luminous quantum yield, a third layer 305 formed of a material with a high hole transporting property, a fourth layer 306 formed of a material with a high hole injecting material, and a second electrode 307 functioning as an anode are laminated in this order. Note that reference numeral 301 denotes a substrate.

In this embodiment, a light emitting element is formed over a substrate made of glass, plastic or the like. By forming a plurality of such light emitting elements over one substrate, a passive matrix light emitting device can be manufactured. Alternatively, the light emitting elements may be formed over a substrate having a thin film transistor (TFT) array instead of the aforementioned substrate made of glass, plastic or the like. Accordingly, an active matrix type light emitting device can be manufactured, where drive of light emitting elements is controlled by TFTs. Note that the structure of each TFT is not specifically limited. It may be a staggered TFT or an inverted staggered TFT. As for a driver circuit formed on the TFT array substrate also, one or both of n-channel transistors and p-channel transistors may be used.

Embodiment Mode 4

In this embodiment mode, a light emitting device having a light emitting element of the present invention is described.

Figure 5A:
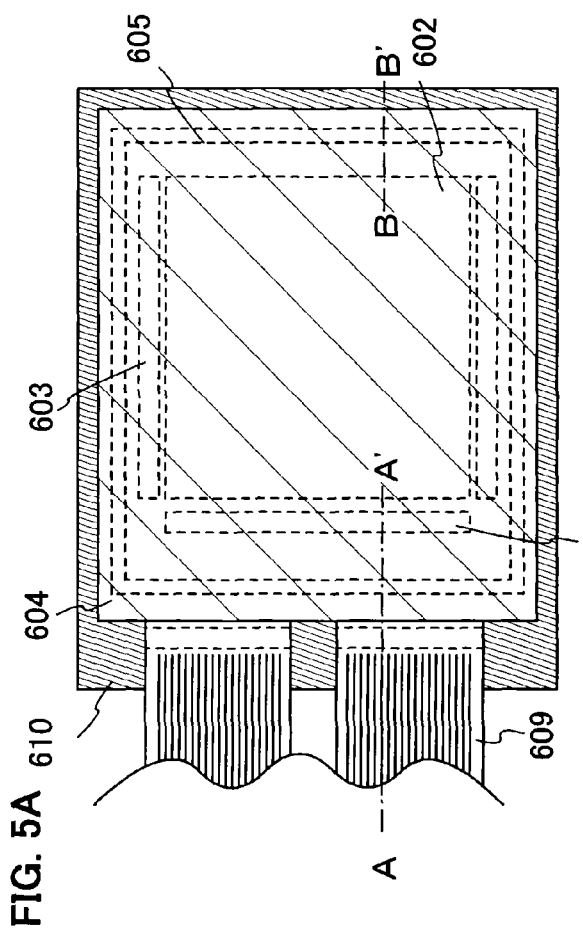
FIGS. 5A and 5B are diagrams describing a light emitting device of the present invention.
Figure 5B:
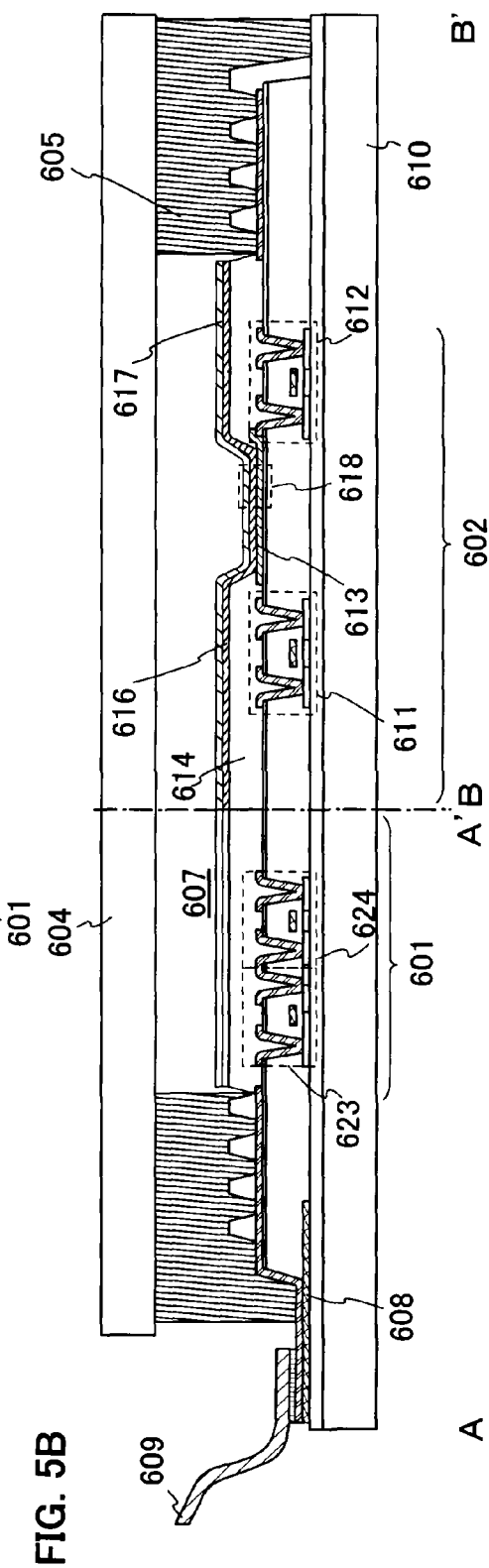

A light emitting device having a light emitting element of the invention in a pixel portion will be explained in this embodiment with reference to FIGS. 5A and 5B. FIG. 5A is a top view showing the light emitting device and FIG. 5B is a cross-sectional view of FIG. 5A taken along line A-A' and B-B'. Reference numeral 601 indicated by dotted lines denote a driver circuit area (a source driver circuit); 602, a pixel portion; and 603, a driver circuit area (a gate driver circuit). Reference numeral 604 denotes a sealing substrate; 605, a sealant; and a portion surrounded by the sealant 605 is a space 607.

Note that a lead wiring 608 is a wiring for transmitting a signal to be inputted to the source driver circuit 601 and the gate driver circuit 603 and receives a video signal, a clock signal, a start signal, a reset signal, or the like from an FPC (flexible printed circuit) 609 that is an external input terminal. Note that only the FPC is shown here; however, the FPC may be provided with a printed wiring board (PWB). The light emitting device in this specification includes not only a light emitting device itself but also a light emitting device mounted with an FPC or a PWB attached.

Subsequently, a cross-sectional structure will be explained with reference to FIG. 5B. The driver circuit area and the pixel portion are formed over an element substrate 610. Here, the source driver circuit 601 which is the driver circuit area and one pixel in the pixel portion 602 are shown.

Note that a CMOS circuit which is a combination of an n-channel TFT 623 and a p-channel TFT 624 is formed as the source driver circuit 601. A TFT for forming the driver circuit may be formed using a known CMOS circuit, a PMOS circuit, or an NMOS circuit. A driver integration type in which a driver circuit is formed over a substrate is described in this embodiment, but it is not necessarily required and a driver circuit can be formed outside the substrate.

The pixel portion 602 has a plurality of pixels, each of which includes a switching TFT 611, a current control TFT 612, and a first electrode 613 which is electrically connected to a drain of the current control TFT 612. Note that an insulator 614 is formed to cover an end of the first electrode 613. Here, a positive type photosensitive acrylic resin film is used.

The insulator 614 is formed to have a curved surface at an upper end or a lower end thereof. For example, in the case of using a positive type photosensitive acrylic for a material of the insulator 614, the insulator 614 is preferably formed to have a curved surface with a curvature radius (0.2 µm to 3 µm) only at an upper end. Either a negative type which becomes insoluble in an etchant by light irradiation or a positive type which becomes soluble in an etchant by light irradiation can be used as the insulator 614.

Each of a layer 616 containing a light emitting material and a second electrode 617 are formed over the first electrode 613. Here, a material having a high work function is preferably used as a material for the first electrode 613 which functions as an anode. For example, the first electrode 613 can be formed by using a single-layer film such as an ITO film, an indium tin oxide film containing silicon, an indium oxide film containing zinc oxide of 2 wt % to 20 wt %, a titanium nitride film, a chromium film, a tungsten film, a Zn film, or a Pt film; a lamination layer of a titanium nitride film and a film containing aluminum as its main component; a three-layer structure of a titanium nitride film, a film containing aluminum as its main component, and another titanium nitride film; or the like. When the first electrode 613 has a layered structure, it can have low resistance as a wiring and form a preferable ohmic contact. Further, the first electrode can serve as an anode.

The layer 616 containing a light emitting material has a light emitting region including a material with a high quantum yield shown in Embodiment 1 and a material with a high carrier transporting property. As other materials which constitute the layer 616 containing a light emitting substance, a low molecular weight material, a medium molecular material (including oligomer and dendrimer), or a high molecular weight material may be used. The materials used for the layer containing a light emitting material are generally formed in a single layer or a lamination layer of organic compounds. In the invention, such a structure can also be employed that a film formed of an organic compound partially includes an inorganic compound. In addition, the layer 616 containing a light emitting material may be formed by a known method such as vapor deposition using a vapor-deposition mask, inkjet deposition, or spin coating. Note that the light emitting region is preferably formed by the method shown in Embodiment Mode 2.

As a material used for the second electrode 617 which is formed over the layer 616 containing a light emitting material and functions as a cathode, a material having a low work function (Al, Ag, Li, Ca, or an alloy or a compound thereof such as MgAg, MgIn, AlLi, $CaF_2$, LiF, or calcium nitride) is preferably used. In the case where light generated in the layer 616 containing a light emitting material is transmitted through the second electrode 617, a lamination film of a metal thin film with a thin thickness and a transparent conductive film (of ITO, indium oxide containing zinc oxide of 2 wt % to 20 wt %, indium tin oxide containing silicon, zinc oxide (ZnO), or the like) is preferably used as the second electrode 617.

By attaching the sealing substrate 604 to the element substrate 610 with the sealant 605, a light emitting element 618 is provided in the space 607 surrounded by the element substrate 610, the sealing substrate 604, and the sealant 605. Note that the space 607 is filled with a filler, but the space 607 may be filled with the sealant 605 as well as an inert gas (nitrogen, argon, or the like).

Note that an epoxy-based resin is preferably used for the sealant 605. The material preferably allows as little moisture and oxygen as possible to penetrate. As the sealing substrate 604, a plastic substrate formed of FRP (Fiberglass-Reinforced Plastics), PVF (polyvinyl fluoride), Myler, polyester, acrylic, or the like can be used other than a glass substrate or a quartz substrate.

As described, a light emitting device having a light emitting element of the present invention can be obtained.

The light emitting device of the present invention includes a light emitting element having a light emitting region with a multiple quantum well structure shown in Embodiment 1 and having a high luminous quantum yield. According to the present invention, a light emitting device in which power consumption is reduced can be provided.

Figure 6:
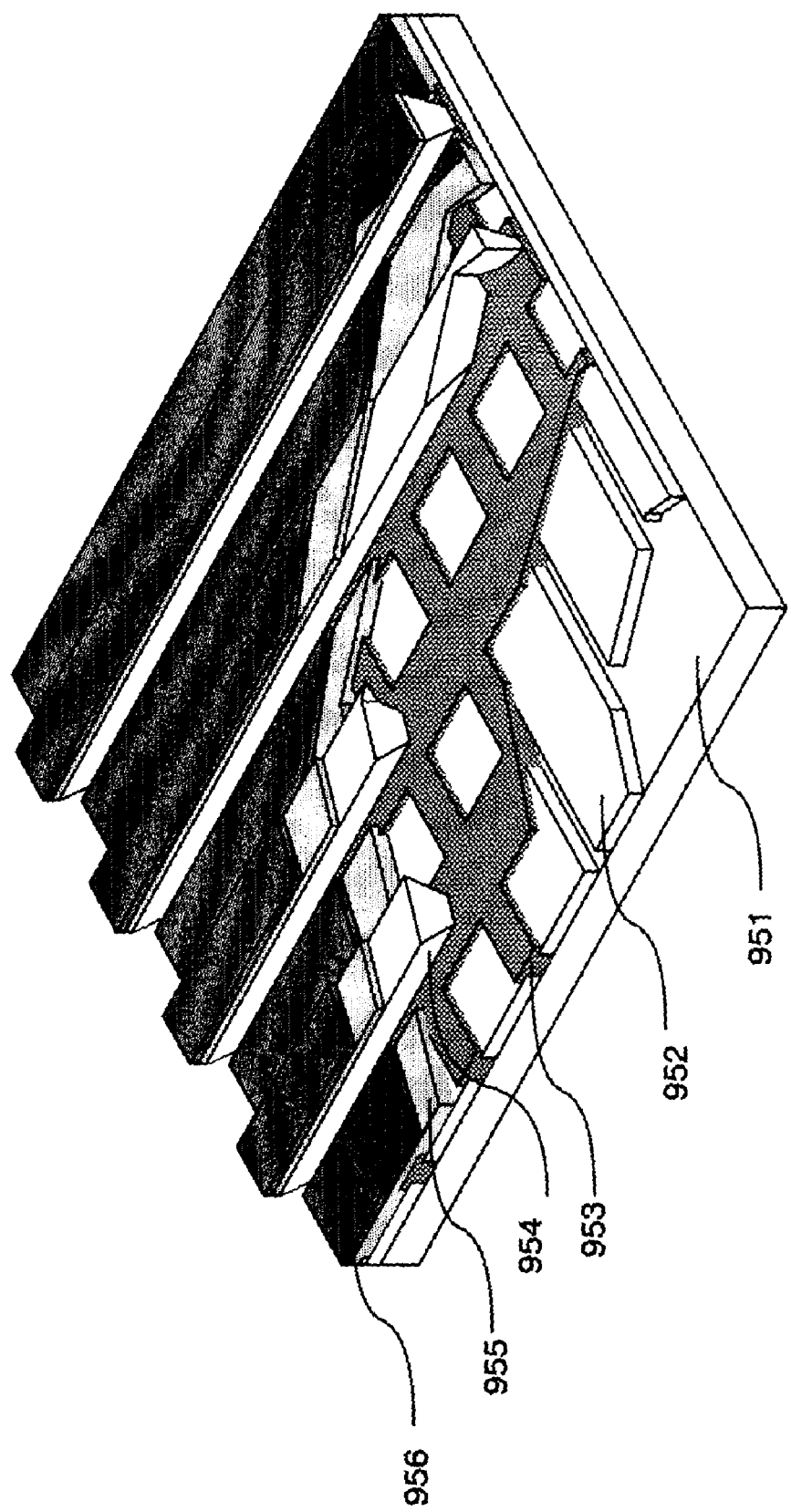
FIG. 6 is a diagram describing a light emitting device of the present invention.

As described heretofore, although this embodiment illustrates an active matrix light emitting device where drive of light emitting elements is controlled with transistors, a passive matrix light emitting device may be formed as well, where light emitting elements are driven without specifically providing driving elements such as transistors. FIG. 6 shows a perspective view of a passive matrix light emitting device manufactured in accordance with the invention. In FIG. 6, a layer 955 containing a light emitting substance is provided between an electrode 952 and an electrode 956 over a substrate 951. An end portion of the electrode 952 is covered with an insulating layer 953. Over the insulating layer 953, a partition layer 954 is provided. The partition layer 954 has tapered sidewalls with such a slope that the distance between opposite sidewalls diminishes toward the substrate surface. That is, the cross section of the partition layer 954 in the short side direction has a trapezoidal shape where a bottom base (side in the same direction as the surface direction of the insulating layer 953, which is in contact with the insulating layer 953) is shorter than a top base (side in the same direction as the surface direction of the insulating layer 953, which is not in contact with the insulating layer 953). By providing the partition layer 954 in this manner, defects of light emitting elements resulting from static electricity or the like can be prevented. Further even a passive matrix light emitting device can be driven with low power consumption by including a light emitting element of the invention with a high luminous quantum yield.

Embodiment Mode 5

In this embodiment, description is made on electronic apparatuses of the invention each having a light emitting device shown in Embodiment 4 as a part. The electronic apparatus of the invention includes a light emitting region shown in Embodiment Mode 1 and Embodiment Mode 3, and a display area with low power consumption.

As an electronic apparatus manufactured with the light emitting device of the invention as a display device includes a video camera or a digital camera, a goggle type display, a navigation system, an audio reproducing device (e.g., car audio, audio component stereo, or the like), a computer, a game machine, a portable information terminal (e.g., mobile computer, portable phone, portable game machine, electronic book, or the like), an image reproducing device provided with a recording medium (specifically, a device for reproducing a recording medium such as a digital versatile disc (DVD) and having a display device for displaying the reproduced image), and the like. Specific examples of such electronic apparatuses are shown in FIG. 7A to FIG. 7E.

Figure 7A:
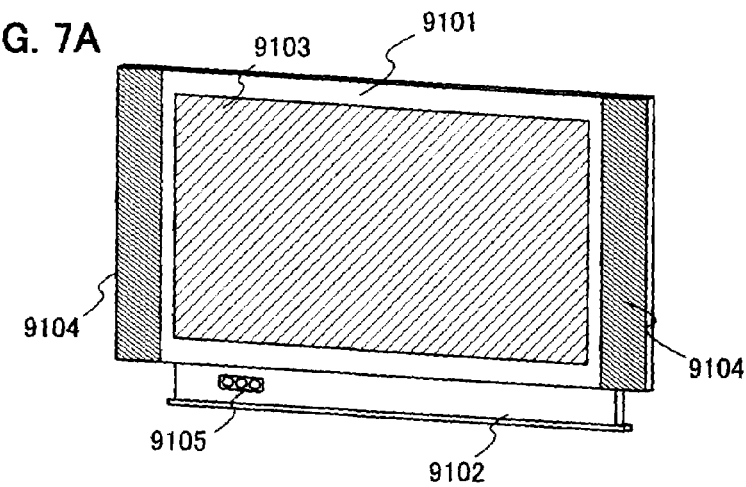
FIGS. 7A to 7E are diagrams describing electronic apparatuses using a light emitting device of the present invention.

FIG. 7A shows a television set in accordance with the invention, which includes a housing 9101, a supporting base 9102, a display area 9103, speaker portions 9104, a video input terminal 9105, and the like. In this television set, the display area 9103 has a matrix arrangement of light emitting elements which are similar to the ones described in Embodiments 1 and 3. The light emitting elements have such advantages that the luminous efficiency is high. Since the display area 9103 constructed of such light emitting elements has similar characteristics, this television set has no degradation in image quality and consumes low power. With such characteristics, the television set can have a significantly reduced number or size of a degradation correction function and power source circuits. Therefore, the housing 9101 and the supporting base 9102 can be reduced in size and weight. Since the television set in accordance with the invention can achieve low power consumption, high image quality and reduction in size and weight, products suitable for any residential environment can be provided.

Figure 7B:
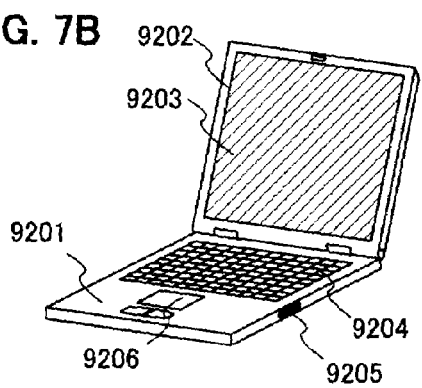

FIG. 7B shows a computer in accordance with the invention, which includes a main body 9201, a housing 9202, a display area 9203, a keyboard 9204, an external connecting port 9205, a pointing mouse 9206, and the like. In this computer, the display area 9203 has a matrix arrangement of light emitting elements which are similar to the ones described in Embodiments 1 and 3. The light emitting elements have such advantages that the luminous efficiency is high. Since the display area 9203 constructed of such light emitting elements has similar characteristics, this computer consumes low power. With such characteristics, the computer can have a significantly reduced number or size of a degradation correction function and power source circuits. Therefore, the main body 9201 and the housing 9202 can be reduced in size and weight. Since the computer in accordance with the invention can achieve low power consumption, high image quality, and reduction in size and weight, products suitable for any residential environment and portable use can be provided.

Figure 7C:
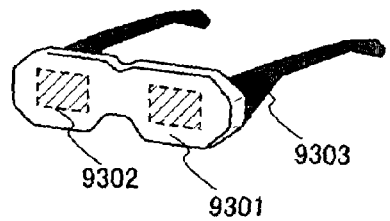

FIG. 7C shows a goggle display in accordance with the invention, which includes a main body 9301, a display area 9302, an arm portion 9303, and the like. In this goggle display, the display area 9302 has a matrix arrangement of light emitting elements which are similar to the ones described in Embodiments 1 and 3. The light emitting elements have such an advantage that the luminous efficiency is high. Since the display area 9302 constructed of such light emitting elements has similar characteristics, this goggle display consumes low power. With such characteristics, the goggle display can have a significantly reduced number or size of a degradation correction function and power source circuits. Therefore, the main body 9301 can be reduced in size and weight. Since the goggle display in accordance with the invention can achieve low power consumption, high image quality and reduction in size and weight, the user suffers few uncomfortable feeling, and thus comfortable products can be provided.

Figure 7D:
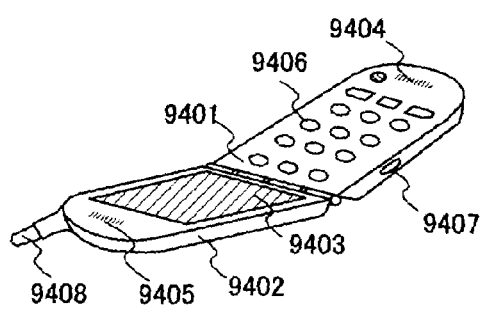

FIG. 7D shows a portable phone in accordance with the invention, which includes a main body 9401, a housing 9402, a display area 9403, an audio input portion 9404, an audio output portion 9405, an operating key 9406, an external connecting port 9407, an antenna 9408, and the like. In this portable phone, the display area 9403 has a matrix arrangement of light emitting elements which are similar to the ones described in Embodiments 1 and 3. The light emitting elements have such an advantage that the luminous efficiency is high. Since the display area 9403 constructed of such light emitting elements has similar characteristics, this portable phone consumes low power. With such characteristics, the portable phone can have a significantly reduced number or size of a degradation correction function and power source circuits. Therefore, the main body 9401 and the housing 9402 can be reduced in size and weight. Since the portable phone in accordance with the invention can achieve low power consumption, high image quality, and reduction in size and weight, products suitable for portable use can be provided.

Figure 7E:
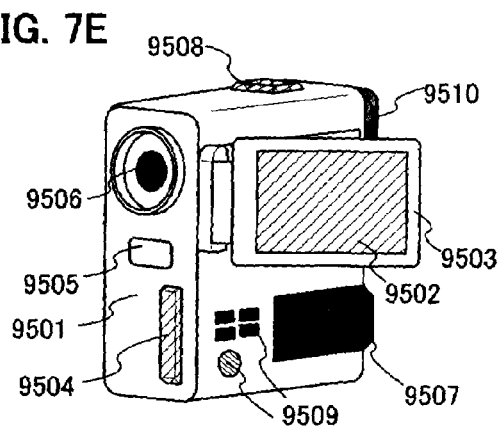

FIG. 7E shows a camera in accordance with the invention, which includes a main body 9501, a display area 9502, a housing 9503, an external connecting port 9504, a remote receiving portion 9505, an image receiving portion 9506, a battery 9507, an audio input portion 9508, operating keys 9509, an eye piece portion 9510, and the like. In this camera, the display area 9502 has a matrix arrangement of light emitting elements which are similar to the ones described in Embodiments 1 and 3. The light emitting elements have such an advantage that luminous efficiency is high. Since the display area 9502 constructed of such light emitting elements has similar characteristics, this camera has no degradation in image quality and consumes low power. With such characteristics, the camera can have a significantly reduced number or size of a degradation correction function and power source circuits. Therefore, the main body 9501 can be reduced in size and weight. Since the camera in accordance with the invention can achieve low power consumption, high image quality, and reduction in size and weight, products suitable for portable use can be provided.

As described above, the applicable range of the light emitting device of the invention is so wide that the light emitting device can be applied to electronic apparatuses in various fields. By using the light emitting device of the invention, electronic apparatuses having display areas with low power consumption can be provided.

The light emitting device of the invention has a light emitting element with high luminous efficiency, and can also be used as a lighting installation. Modes using the light emitting element of the invention as the lighting installation are described with reference to FIG. 8 and FIGS. 9A to 9C.

Figure 8:
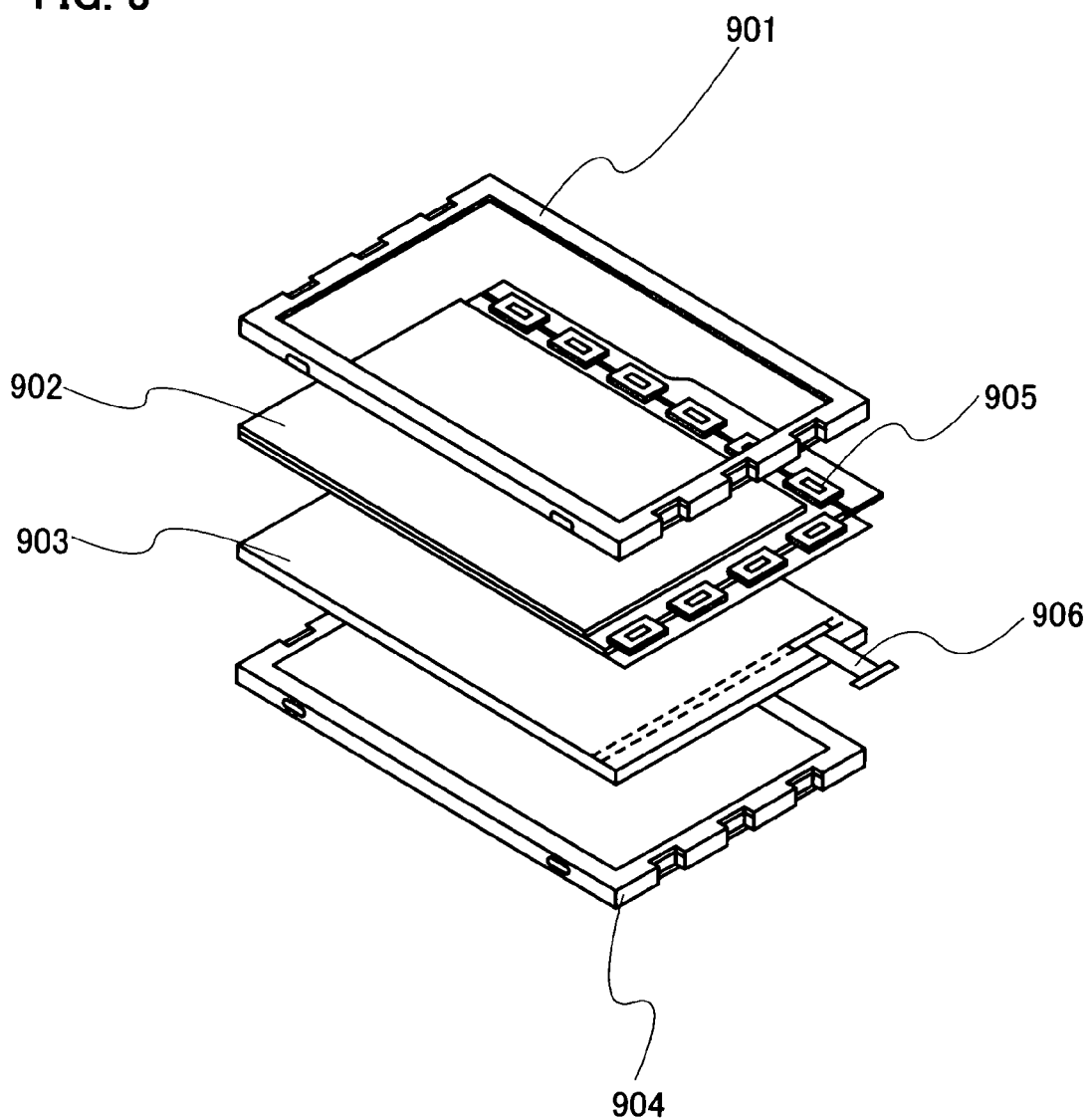
FIG. 8 is a diagram describing an electronic apparatus using a light emitting device of the present invention.

FIG. 8 shows an example of a liquid crystal display device using the light emitting device of the present invention as a backlight. The liquid crystal display device shown in FIG. 8 includes a housing 901, a liquid crystal layer 902, a backlight 903, and a housing 904, and the liquid crystal layer 902 is connected to a driver IC 905. The light emitting device of the present invention is used as the backlight 903, and current is supplied to a terminal 906.

By using the light emitting device of the present invention as the backlight, a backlight with reduced power consumption can be obtained. The light emitting device of the invention is a plane emission type lighting installation, and can have a large area. Therefore, the backlight can have large area, and a liquid crystal display device having a large area can be obtained. Furthermore, since the light emitting device is thin and consumes low power, the thickness and power consumption of a display device can also be reduced.

Figure 9A:
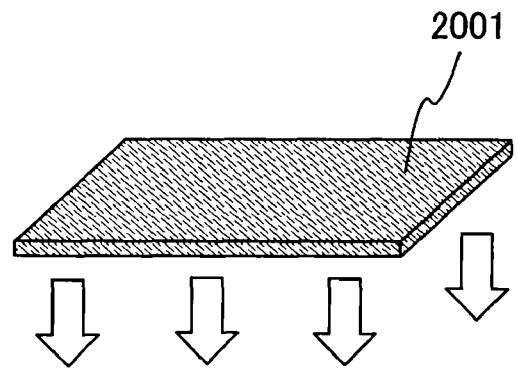
FIGS. 9A to 9C are diagrams describing electronic apparatuses using a light emitting device of the present invention.

In FIG. 9A, the light emitting device of the invention is used as an indoor lighting device 2001. Since the power consumption of the light emitting device of the invention is reduced, a lighting installation with low power consumption can be obtained. Because of a plane emission type lighting installation, which can be used in a large area, for example the light installation of the present invention can be used on a ceiling plane. Furthermore, it is not limited to be used on a ceiling, the light emitting device of the invention can be used at a wall, a floor, a pillar, or the like. By manufacturing a light emitting device of the invention using a flexible substrate, a lighting installation, which is thin and flexible, can be obtained. Therefore, the lighting installation can be also set on a curved surface. Farther, the lighting installation can be used not only indoors but also outdoors, for example, as an outdoor lamp at a wall of a building.

Figure 9B:
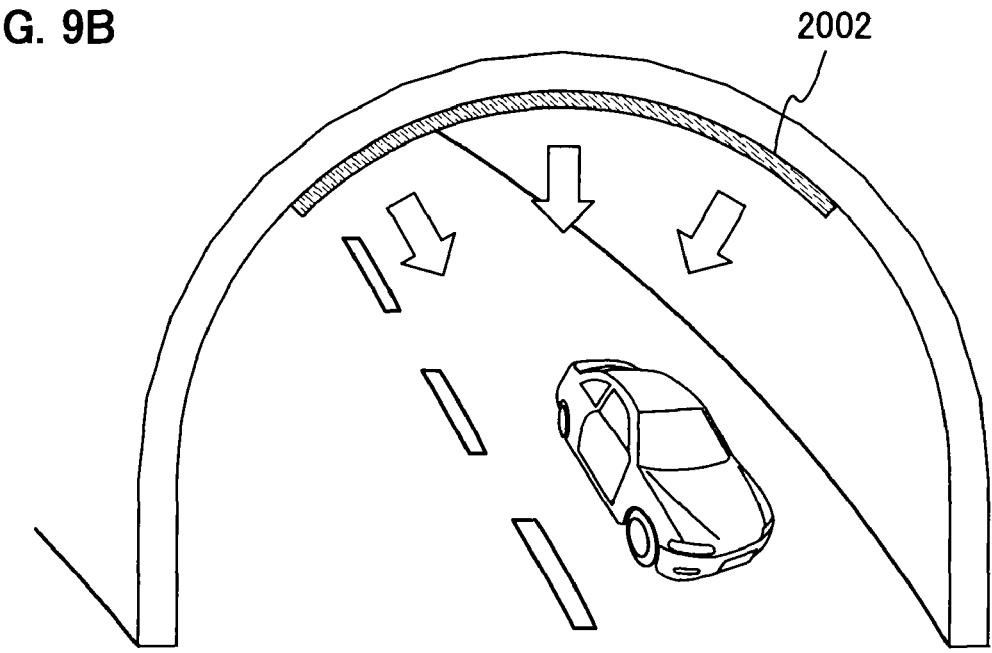

In FIG. 9B, the light emitting device of the invention is used as a lighting device 2002 in a tunnel. Since the power consumption of the light emitting device of the invention is reduced, a lighting installation with low power consumption can also be obtained. By manufacturing a light emitting device of the invention using a flexible substrate, lighting installation, which is thin and flexible, can also be obtained. Therefore, the lighting installation can be placed along a curved surface of the wall in the tunnel.

Figure 9C:
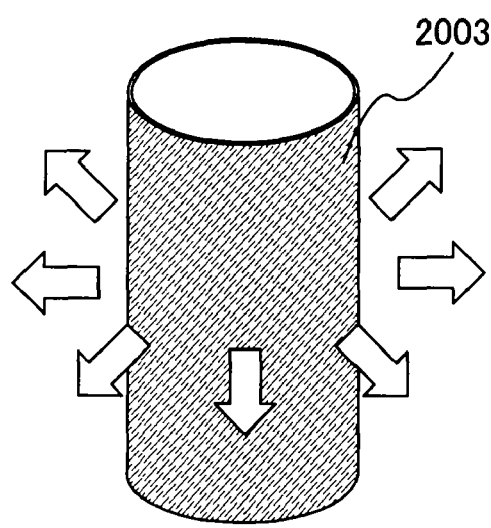

In FIG. 9C, the light emitting device of the invention is used as an interior lighting device 2003. Since the power consumption of the light emitting device of the invention is reduced, a lighting installation with low power consumption can be obtained. By manufacturing a light emitting device of the invention using a flexible substrate, a lighting installation, which is thin and flexible, can be obtained. Since the light emitting device of the invention is a plane emission type, and therefore can be processed into a free shape.

The light emitting device of the invention can also be used as a lighting device for taking a picture. When taking a picture, by lightening a subject with light having high brightness at a large area, the picture can be taken similar to case where a subject is lightened by natural light.

This application is based on Japanese Patent Application serial no. 2005-148733 filed in Japan Patent Office on May 20, 2005, the entire contents of which are hereby incorporated by reference.

What is claimed is:

1. A light emitting device comprising a light emitting element comprising:
    a light emitting layer comprising a light emitting region between a pair of electrodes,
    wherein the light emitting region comprises:
        plural materials with a high luminous quantum yield; and
        a material with a high carrier transporting property,
    wherein the light emitting region comprises:
        a region in which at least one of the plural materials with a high luminous quantum yield is dispersed in the material with a high carrier transporting property; and
        a region in which a concentration of the material with a high carrier transporting property is high.

2. A light emitting device according to claim 1,
    wherein a highest occupied molecular orbital level of the at least one of the plural materials with a high luminous quantum yield is higher than a highest occupied molecular orbital level of the material with a high carrier transporting property, and a lowest unoccupied molecular orbital level of the at least one of the plural materials with a high luminous quantum yield is lower than a lowest unoccupied molecular orbital level of the material with a high carrier transporting property.

3. A light emitting device according to claim 1,
    wherein a thickness of the region in which at least one of the plural materials with a high luminous quantum yield is dispersed in the material with a high carrier transporting property is preferably 20 nm or less.

4. A light emitting device according to claim 1,
    wherein a thickness of the region in which at least one of the plural materials with a high luminous quantum yield is dispersed in the material with a high carrier transporting property is preferably 5 nm or less.

5. A light emitting device according to claim 1,
    wherein a thickness of the region in which a concentration of the material with a high carrier transporting property is high is 20 nm or less.

6. A light emitting device according to claim 1,
    wherein a thickness of the region in which a concentration of the material with a high carrier transporting property is high is 5 nm or less.

7. A light emitting device according to claim 1,
    wherein the region in which at least one of the plural materials with a high luminous quantum yield is dispersed in the material with a high carrier transporting property comprises the one of the plural materials with a high luminous quantum yield at 0.001 wt % to 50 wt %.

8. A light emitting device according to claim 1,
    wherein the region in which at least one of the plural materials with a high luminous quantum yield is dispersed in the material with a high carrier transporting property comprises the one of the plural materials with a high luminous quantum yield at 0.03 wt % to 30 wt %.

9. A light emitting device according to claim 1, wherein the one of the plural materials with a high luminous quantum yield emits a light having a complementary color relationship with another one of the plural materials with a high luminous quantum yield.

10. A light emitting device according to claim 1, wherein the light emitting element emits white light.

11. A light emitting device according to claim 1, wherein the one of material with a high luminous quantum yield emits fluorescence.

12. A light emitting device according to claim 1, wherein the one of material with a high luminous quantum yield emits phosphorescence.

13. A light emitting device according to claim 12, wherein a triplet level of the one of the plural materials with a high luminous quantum yield is lower than a triplet level of the material with a high carrier transporting property.

14. A light emitting device according to claim 1, wherein the material with a high carrier transporting property is a material in which an electron transporting property is higher than a hole transporting property.

15. A light emitting device according to claim 1, wherein the material with a high carrier transporting property is a material in which the hole transporting property is higher than the electron transporting property.

16. A light emitting device according to claim 1, further comprising a control circuit for controlling a light-emission of the light emitting element.

17. A light emitting device according to claim 1, wherein the region in which at least one of the plural materials with a high luminous quantum yield is dispersed in the material with a high carrier transporting property is a region in which a concentration of the at least one of the plural materials with a high luminous quantum yield is high.

18. A light emitting device according to claim 1, wherein each of the plural materials with a high luminous quantum yield shows a higher luminous quantum yield in a solution thereof than the material with a high carrier transporting property in a solution thereof at a common concentration.

19. A light emitting device according to claim 1, wherein the material with a high carrier transporting property may show a higher mobility of carriers than the materials with a high luminous quantum yield.

20. A light emitting device according to claim 1, wherein a concentration of the at least one of the materials with a high luminous quantum yield is higher than a concentration of the material with a high carrier transporting property in the region in which at least one of the plural materials with a high luminous quantum yield is dispersed in the material with a high carrier transporting property.

21. A light emitting device according to claim 1, the concentration of the material with a high carrier transporting property is higher than a concentration of the at least one of the materials with a high luminous quantum yield in the region in which the concentration of the material with a high carrier transporting property is high.

* * * * *